(12) United States Patent
Yoshihara et al.

(10) Patent No.: US 9,716,027 B2
(45) Date of Patent: Jul. 25, 2017

(54) METHOD FOR MANUFACTURING SEMICONDUCTOR DEVICE

(71) Applicant: Renesas Electronics Corporation, Koutou-ku, Tokyo (JP)

(72) Inventors: Takamitsu Yoshihara, Gunma (JP); Takahiro Kainuma, Ibaraki (JP); Hiroi Oka, Gunma (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/007,275

(22) Filed: Jan. 27, 2016

(65) Prior Publication Data

US 2016/0293473 A1 Oct. 6, 2016

(30) Foreign Application Priority Data

Mar. 30, 2015 (JP) .................................. 2015-070422

(51) Int. Cl.
*H01L 21/68* (2006.01)
*H01L 21/683* (2006.01)
(Continued)

(52) U.S. Cl.
CPC ........ *H01L 21/6836* (2013.01); *H01L 21/304* (2013.01); *H01L 21/3043* (2013.01); *H01L 21/78* (2013.01); *H01L 23/49524* (2013.01); *H01L 23/49562* (2013.01); *H01L 23/49582* (2013.01); *H01L 24/34* (2013.01);
(Continued)

(58) Field of Classification Search
CPC ...... H01L 21/304; H01L 21/78; H01L 21/301
See application file for complete search history.

(56) References Cited

U.S. PATENT DOCUMENTS 6,558,975 B2 * 5/2003 Sugino ................ H01L 21/6836
257/E21.505
7,179,724 B2 * 2/2007 Nagasawa ............. H01L 21/304
257/E21.237

(Continued)

FOREIGN PATENT DOCUMENTS

JP 2011-96767 A 5/2011
JP 2012-19126 A 1/2012
(Continued)

*Primary Examiner* — Calvin Choi
*Assistant Examiner* — S.M. S Imtiaz
(74) *Attorney, Agent, or Firm* — Shapiro, Gabor and Rosenberger, PLLC

(57) ABSTRACT

Provided is a method of manufacturing a semiconductor device with improved manufacturing efficiency for the semiconductor device. The method of manufacturing a semiconductor device includes the steps of: (a) forming a circuit at a front surface side of a wafer (semiconductor wafer) having the front surface and a back surface opposite to the front surface; (b) grinding the back surface of the wafer that has a center part (first part) and a peripheral edge part (second part) surrounding a periphery of the center part in such a manner that the center part is thinner than the peripheral edge part; (c) attaching an upper surface (bonding surface) of a holding tape to the front surface of the wafer; and (d) separating the center part from the peripheral edge part by cutting a part of the center part with a blade (rotary blade) while the wafer is held by the first tape.

16 Claims, 21 Drawing Sheets

(51) Int. Cl.
*H01L 21/304* (2006.01)
*H01L 21/78* (2006.01)
*H01L 23/00* (2006.01)
*H01L 23/495* (2006.01)

(52) U.S. Cl.
CPC .............. *H01L 2221/6834* (2013.01); *H01L 2221/68327* (2013.01); *H01L 2221/68386* (2013.01)

(56) References Cited

U.S. PATENT DOCUMENTS

| | | | | |
|---|---|---|---|---|
| 7,758,402 B2* | 7/2010 | Yoshida | ............... | B24B 1/00 257/E21.237 |
| 7,994,025 B2* | 8/2011 | Sekiya | ............... | B24B 1/00 257/E21.599 |
| 7,994,026 B2* | 8/2011 | Harikai | ............... | H01J 37/32743 257/E21.214 |
| 8,486,763 B2* | 7/2013 | Jarry | ............... | H01L 21/78 438/113 |
| 8,728,047 B2* | 5/2014 | Ciok | ............... | A61L 24/0031 604/336 |
| 2004/0192012 A1* | 9/2004 | Takezoe | ............... | H01L 21/6835 438/460 |
| 2005/0142815 A1* | 6/2005 | Miyazaki | ............... | H01L 21/02238 438/464 |
| 2007/0004180 A1* | 1/2007 | Abe | ............... | B24B 7/228 438/460 |
| 2007/0080450 A1* | 4/2007 | Kuan | ............... | H01L 22/20 257/737 |
| 2008/0105952 A1* | 5/2008 | Ichikawa | ............... | H01L 21/486 257/621 |
| 2008/0293221 A1* | 11/2008 | Yamamoto | ............... | H01L 21/67132 438/464 |
| 2009/0148997 A1* | 6/2009 | Fukuchi | ............... | H01L 23/544 438/401 |
| 2012/0064669 A1* | 3/2012 | Higuchi | ............... | H01L 21/78 438/114 |
| 2013/0171755 A1* | 7/2013 | Jang | ............... | H01L 33/0095 438/33 |

FOREIGN PATENT DOCUMENTS

| | | |
|---|---|---|
| JP | 2014-138177 A | 7/2014 |
| JP | 2014-170822 A | 9/2014 |

\* cited by examiner

METHOD FOR MANUFACTURING SEMICONDUCTOR DEVICE

CROSS-REFERENCE TO RELATED APPLICATIONS

The disclosure of Japanese Patent Application No. 2015-070422 filed on Mar. 30, 2015 including the specification, drawings, and abstract is incorporated herein by reference in its entirety.

BACKGROUND

The present invention relates to a manufacturing technique for a semiconductor device, and more specifically, to a technique effectively applied to a manufacturing method of a semiconductor device that includes a step of separating a semiconductor wafer to obtain a plurality of semiconductor chips.

Japanese Unexamined Patent Application Publication No. 2011-96767 (Patent Document 1), Japanese Unexamined Patent Application Publication No. 2014-138177 (Patent Document 2), and Japanese Unexamined Patent Application Publication No. 2014-170822 (Patent Document 3) describe methods for grinding the backside of a wafer to leave an outer convex peripheral part in the form of a ring surrounding a device region.

Patent Document 1 discloses a method that involves cutting out the device region from the outer peripheral part and then grinding the backside of the device region. Furthermore, Patent Document 2 discloses a method that involves grinding the backside of a wafer to leave its outer peripheral part, and then separating the device region from the outer peripheral part by a laser and a cutting blade with an adhesive tape attached to the backside of the wafer. Moreover, Patent Document 3 discloses a method that involves grinding the backside of a wafer to leave its outer peripheral part, and then separating the device region from the outer peripheral part by means of a cutting blade in contact with the front surface side of the wafer with an adhesive tape attached to the backside of the wafer.

Japanese Unexamined Patent Application Publication No. 2012-19126 (Patent Document 4) discloses a method that involves cutting an outer peripheral of a wafer with a first blade in a circular shape, and polishing an outer peripheral wall of the wafer with a second blade.

RELATED ART DOCUMENT

Patent Document

[Patent Document 1] Japanese Unexamined Patent Application Publication No. 2011-96767
[Patent Document 2] Japanese Unexamined Patent Application Publication No. 2014-138177
[Patent Document 3] Japanese Unexamined Patent Application Publication No. 2014-170822
[Patent Document 4] Japanese Unexamined Patent Application Publication No. 2012-19126

SUMMARY

In a manufacturing method of a semiconductor device, integrated circuits are collectively formed in a plurality of respective chip regions provided in the device region of the semiconductor wafer, and then the chip regions are separated, thereby producing semiconductor devices. In this case, until the step of separating the chip regions, various types of manufacturing processes are performed on the semiconductor wafer with the chip regions not being separated therefrom.

To process the semiconductor wafer with high accuracy in each of various manufacturing processes, a technique is required to suppress warpage and deformation of the semiconductor wafer. For example, as described in the above-mentioned Patent Document 3, the method that involves grinding the backside of the semiconductor wafer to leave the ring-shaped convex portion at the outer periphery of the device region is effective as a technique for suppressing the warpage and deformation of the semiconductor wafer during a manufacturing process.

However, the aforesaid methods have problems in terms of improving the manufacturing efficiency of semiconductor devices. For example, it is difficult to separate the chip regions with the ring-shaped convex portion formed at the outer periphery of the device region. For this reason, the above-mentioned convex portion needs to be removed before separation of the chip regions. However, depending on a method of removing the ring-shaped convex portion, a wide margin is required to separate the ring-shaped convex portion from the device region, which might reduce an effective area of the device region. Such reduction in effective area of the device region causes degradation in manufacturing efficiency.

Other problems and new features of the present invention will be clarified from the description of the present specification and the accompanied drawings.

In a manufacturing method of a semiconductor device according to one embodiment, one surface of a semiconductor wafer is ground such that a first part is to be thinner than a second part surrounding the first part. In the above-mentioned manufacturing method of a semiconductor device, a bonding surface of a first tape is attached to a surface opposite to the one surface of the semiconductor wafer. The first part is separated from the second part by cutting apart of the first part with a rotary blade in contact with the one surface side of the first part while the semiconductor wafer is held by the first tape.

According to the one embodiment described above, the manufacturing efficiency of the semiconductor device can be improved.

Figure 1:
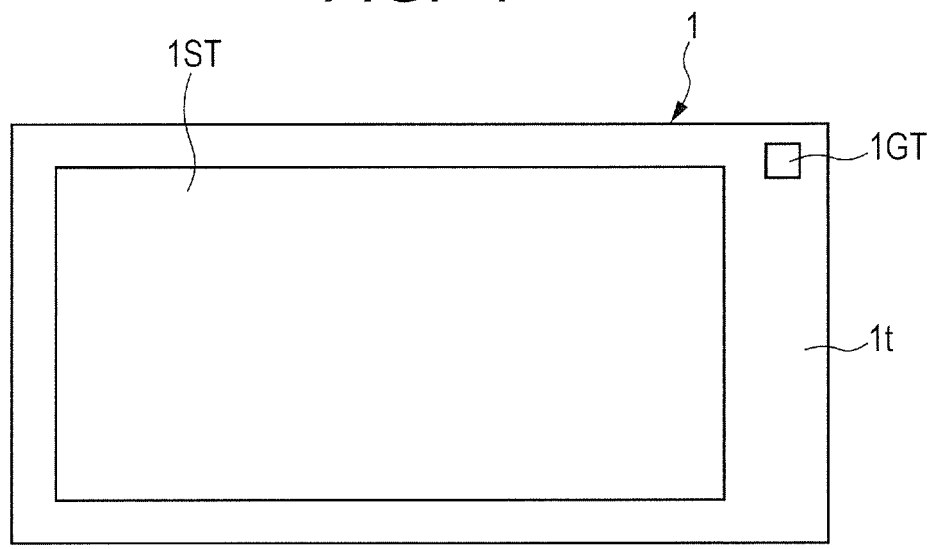
FIG. 1 is a top view of a semiconductor chip in one embodiment.

DETAILED DESCRIPTION (Explanation of Description Format, Basic Terms, and Usage Thereof in Present Application)

In the present application, the following embodiments may be described below by being divided into a plurality of sections or the like for convenience as needed, which are not independent from each other unless otherwise specified. One of the sections may be each part of a single example, the details of a part of the other, a modified example of a part or all of the other, or the like, regardless of the position of the description. In principle, parts having the same function will not be described repeatedly. Respective components of the embodiments are not essential unless otherwise specified, except when limiting the number of the components in theory and when clearly not considered to be so from the context thereof.

Likewise, in the description of the embodiments and the like, the term "X comprised of A" and the like regarding material, composition, etc., does not exclude the case of containing an element other than A as one of principal elements, unless otherwise specified and except when clearly not considered to be so from the context thereof. For example, regarding the component, the above expression means "X containing A as a principal component" or the like. Specifically, the term "silicon member" or the like is not limited to a member made of pure silicon, and can obviously include a member that contains a SiGe (silicon-germanium) alloy, other multicomponent alloys containing silicon as a principal component, other additives, or the like. The term "gold plating", "a Cu layer", "nickel plating", or the like includes not only a pure one, but also a member mainly containing gold, Cu, nickel, or the like as a principal component, unless otherwise specified.

Further, also in referring to a specific numeral value or amount, a numerical value for a component may exceed the specific numerical value, or may be less than the specific numerical value, unless otherwise specified, and except when limited to the specific number in theory, or clearly not considered to be so from the context thereof.

In each drawing of the embodiments, the same or like parts are indicated by the same or similar reference character or number, and its description will not be repeated in principle.

In the accompanying drawings, even a cross-sectional view may omit hatching or the like in some cases if the hatching possibly makes the sectional view complicated, or when a cavity is easy to discriminate. In this context, the outline of a hole closed in a planar manner with respect to the background may be omitted when clearly seen from the description or the like. Further, in order to represent a part which is not a cavity or to clearly represent a boundary between regions, a hatching or dot pattern is sometimes given even when the figure is not a cross-sectional view.

<Semiconductor Device>

Figure 2:
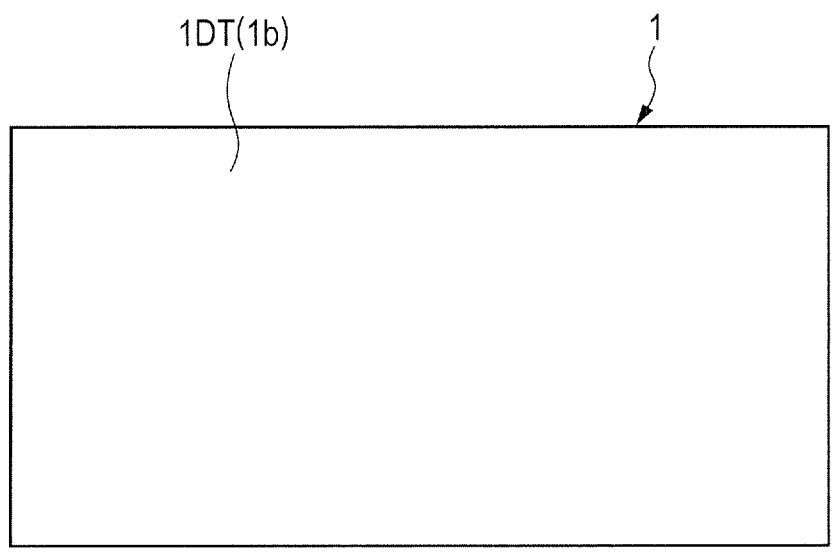
FIG. 2 is a bottom view of the semiconductor chip shown in FIG. 1.
Figure 3:
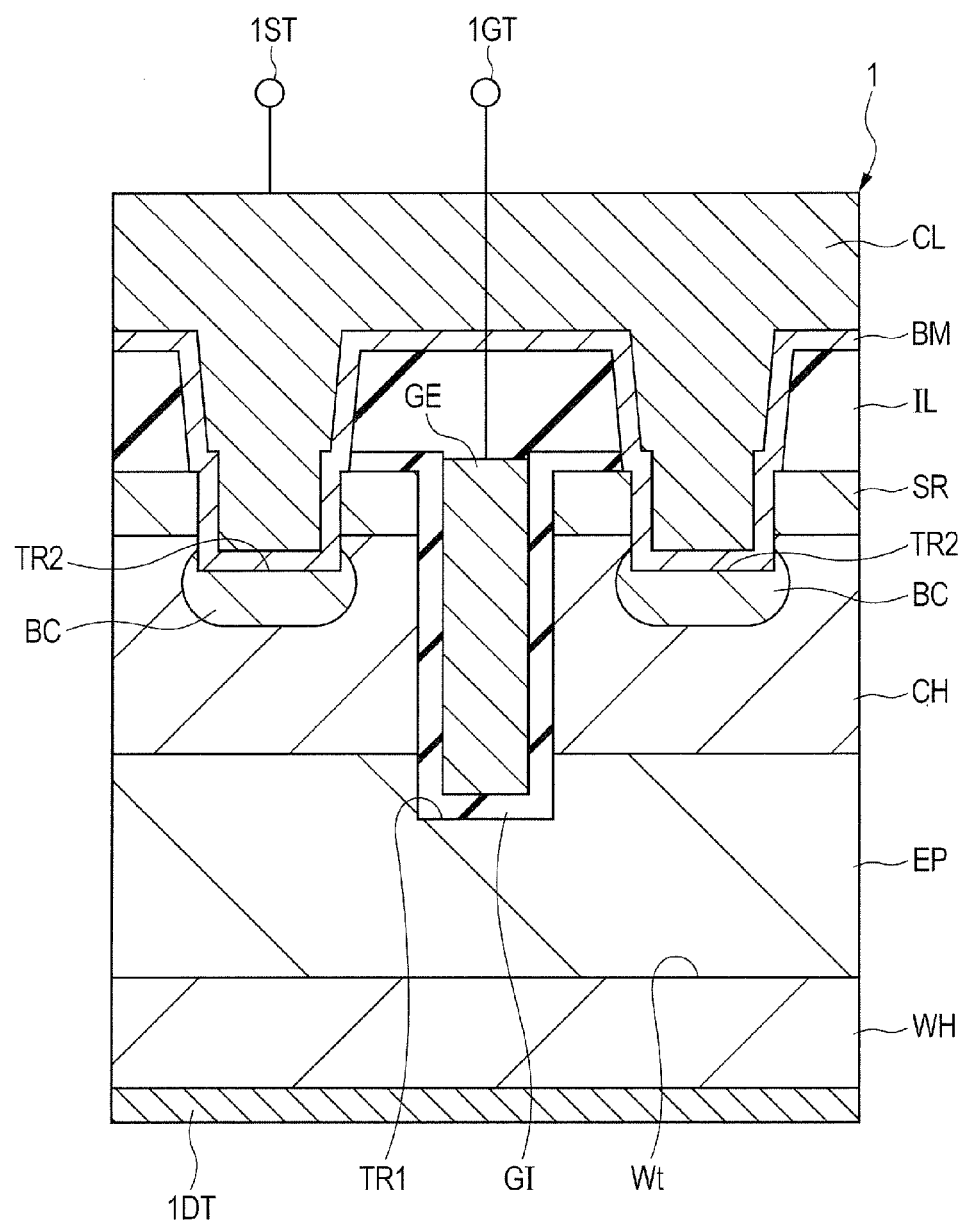
FIG. 3 is a cross-sectional view showing an example of a main part of an element structure of a field-effect transistor included in the semiconductor chip shown in FIGS. 1 and 2.

This embodiment will explain a semiconductor chip 1 (see FIG. 1) that includes, for example, a transistor element incorporated in a power converter and the like and used as a switching element, as well as a semiconductor device PKG1 with the semiconductor chip 1 mounted thereon, by way of example of a semiconductor device. FIG. 1 is a top view of the semiconductor chip of this embodiment, while FIG. 2 is a bottom view of the semiconductor chip shown in FIG. 1. FIG. 3 is a cross-sectional view showing an example of a main part of an element structure of a field-effect transistor included in the semiconductor chip shown in FIGS. 1 and 2.

The semiconductor chip 1 in this embodiment has a front surface (surface, upper surface) 1t shown in FIG. 1, and a back surface (surface, lower surface) 1b opposite to the front surface 1t (see FIG. 2). The semiconductor chip 1 has a plurality of electrodes. In an example of this embodiment, the semiconductor chip 1 has a gate terminal (electrode pad) 1GT and a source terminal (electrode pad) 1ST at the front surface 1t side. The semiconductor chip 1 has a drain terminal (electrode pad) 1DT at the back surface 1b side.

Furthermore, the semiconductor chip 1 includes circuits with semiconductor elements. In the example shown in FIG. 3, the semiconductor chip 1 includes, for example, an n-channel metal oxide semiconductor field effect transistor (MOSFET). The semiconductor chip 1 is, for example, a so-called power semiconductor device that is incorporated in a power conversion circuit, such as a DC-DC converter or an inverter, and used as a switching element.

Referring to the structural example shown in FIG. 3, the semiconductor chip 1 has, for example, a semiconductor substrate WH made of n-type monocrystalline silicon. An n-type epitaxial layer EP is formed over a main surface Wt of the semiconductor substrate WH. The semiconductor substrate WH and the epitaxial layer EP configures a drain region of the MOSFET. The drain region is electrically coupled to a drain terminal 1DT formed at the back surface 1b side of the semiconductor chip 1. In an example shown in FIG. 2, the drain terminal 1DT is formed across the entire back surface 1b of the semiconductor chip 1.

A channel formation region CH is formed as a $p^-$-type semiconductor region over the epitaxial layer EP. A source region SR is formed as an $n^+$-type semiconductor region over the channel formation region CH. A trench (opening, groove) TR1 is formed from the upper surface of the source region SR through the channel formation region CH to reach the inside of the epitaxial layer EP.

A gate insulating film GI is formed over an inner wall of the trench TR1. The gate electrode GE laminated to fill the trench TR1 is formed over the gate insulating film GI. The gate electrode GE is electrically coupled to a gate terminal 1GT of the semiconductor chip 1 shown in FIG. 1 via a lead wire.

Trenches (openings, grooves) TR2 for body contact are formed adjacent to the trench TR1 with the gate electrode GE embedded therein, via the respective source regions SR. In the example shown in FIG. 3, the trenches TR2 are formed adjacent to both sides of the trench TR1. A body contact region BC as a $p^+$-type semiconductor region is formed at the bottom of each trench TR2. By providing the body contact region BC, a parasitic bipolar transistor including the source region SR as an emitter region, the channel formation region CH as a base region, and the epitaxial layer EP as a collector region can reduce its base resistance.

In the example shown in FIG. 3, the trench TR2 for the body contact is formed, whereby the upper surface of the body contact region BC is positioned under the lower surface of the source region SR (on the lower surface side of the channel formation region CH). Although the illustration is omitted, as a modified example, the body contact region BC may be formed at the substantially same height as that in the source region SR without forming the trench TR2 for body contact.

An insulating film IL is formed over the source region SR and the gate electrode GE. A barrier conductive film BM is formed over the insulating film IL and the region including the inner wall of the trench TR2 for the body contact. A wiring CL is formed over the barrier conductive film BM. The wiring CL is electrically coupled to a source terminal 1ST formed at the surface of the semiconductor chip 1 shown in FIG. 1.

The wiring CL is electrically coupled to both the source region SR and the body contact region BC via the barrier conductive film BM. That is, the source region SR and the body contact region BC are at the same potential. This arrangement can prevent the above-mentioned parasitic bipolar transistor from being turned on due to a difference in potential between the source region SR and the body contact region BC.

In the MOSFET shown in FIG. 3, the drain region and the source region SR are arranged with the channel formation region CH sandwiched therebetween in the thickness direction to thereby form the channel in the thickness direction (hereinafter referred to as a vertical channel structure). In this case, the occupancy area of an element in the planar view can be reduced, compared to a field-effect transistor with a channel formed along the main surface Wt. Thus, the planar size of the semiconductor chip 1 (see FIG. 1) can be reduced.

In the case of the above-mentioned vertical channel structure, the semiconductor chip 1 can be thinned to reduce its on-resistance. For example, in a switching circuit including a high-side switch and a low-side switch, when using a MOSFET as the low-side switch, the on-time of the low-side switch is longer than the on-time of the high-side switch. Thus, in the MOSFET used in the low-side switch, the loss due to the on-resistance seems to be more serious than the switching loss. For this reason, the above-mentioned vertical channel structure is applied to the low-side MOSFET, which can decrease the on-resistance of the low-side field-effect transistor.

Note that FIG. 3 illustrates an element structure of the field-effect transistor. In the semiconductor chip 1 shown in FIG. 1, for example, a plurality of field-effect transistors with the element structure shown in FIG. 3 are coupled together in parallel. In this way, a power MOSFET can be configured that allows for circulation of a large current exceeding, for example, 1 A.

Figure 4:
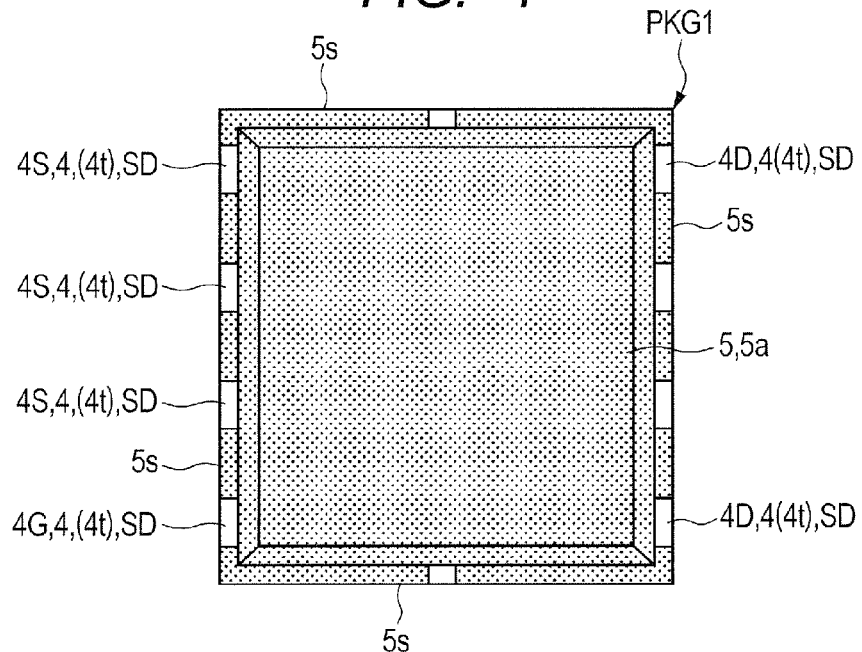
FIG. 4 is a top view of a semiconductor device (semiconductor package) with the semiconductor chip shown in FIG. 1 mounted thereon.
Figure 5:
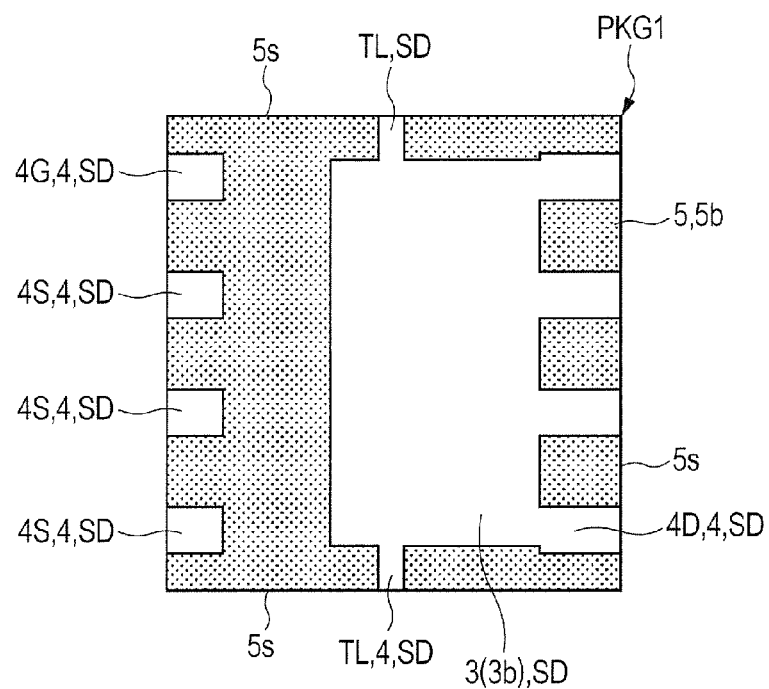
FIG. 5 is a bottom view of the semiconductor chip shown in FIG. 4.
Figure 6:
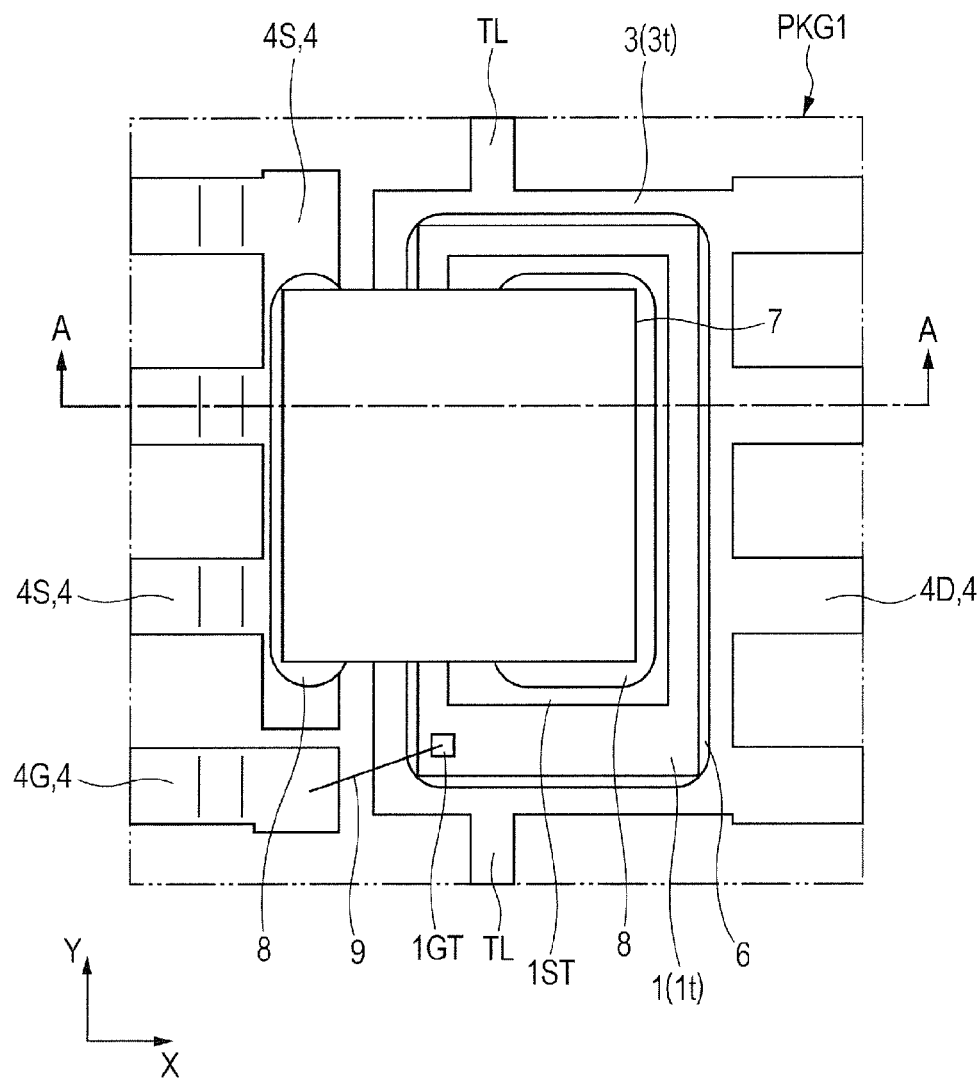
FIG. 6 is a plan view showing an internal structure of the semiconductor device with a sealing body shown in FIG. 4 removed therefrom.
Figure 7:
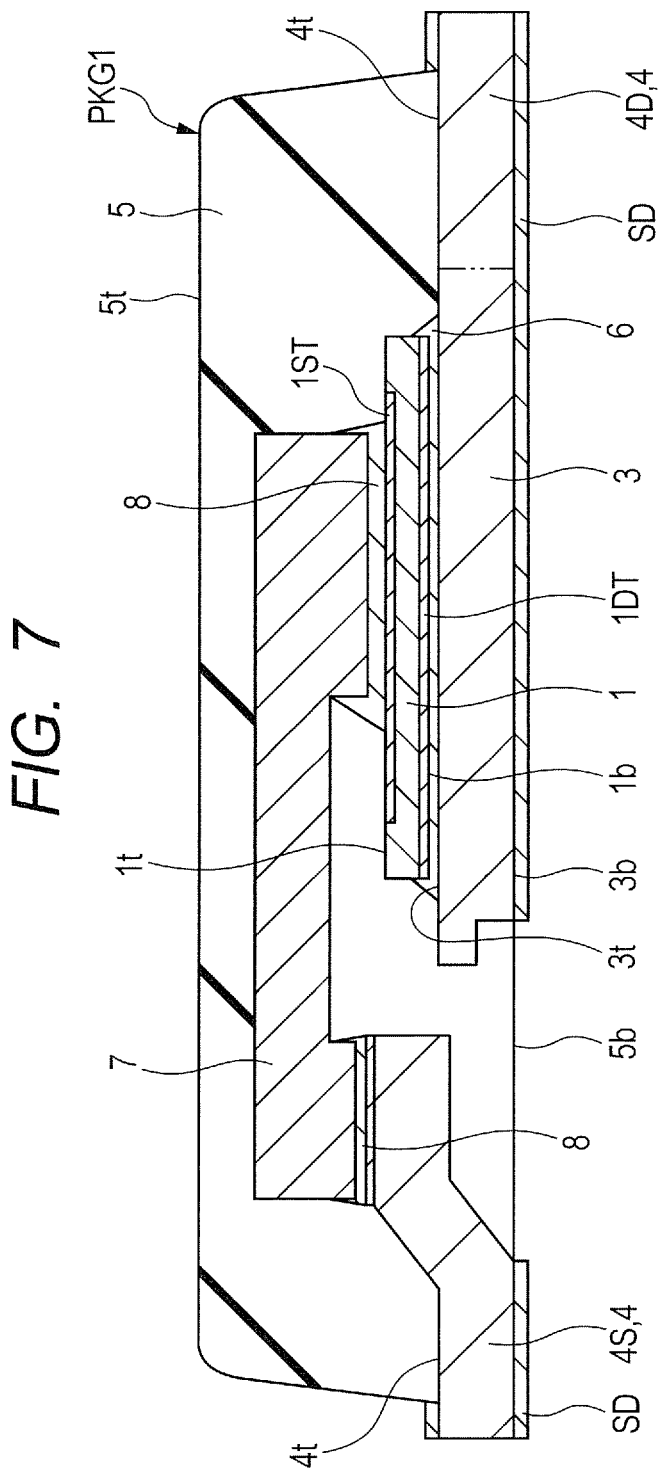
FIG. 7 is a cross-sectional view taken along the line A-A of FIG. 6.

Next, an example of a semiconductor package structure on which the semiconductor chip 1 shown in FIG. 1 is mounted will be described. FIG. 4 is a top view of the semiconductor device (semiconductor package) on which the semiconductor chip shown in FIG. 1 is mounted. FIG. 5 is a bottom view of the semiconductor device shown in FIG. 4. FIG. 6 is a plan view showing an internal structure of the semiconductor device with a sealing body shown in FIG. 4 removed therefrom. FIG. 7 is a cross-sectional view taken along the line A-A of FIG. 6.

As shown in FIGS. 4 to 7, a semiconductor device PKG1 includes a semiconductor chip 1 (see FIGS. 6 and 7), a tab 3 on which the semiconductor chip 1 is mounted (see FIGS. 5 to 7), and a plurality of leads 4 serving as external terminals (see FIGS. 5 to 7). The semiconductor chip 1, an upper surface 3t of the tab 3, and upper surfaces 4t of the leads are collectively sealed with a sealing body (resin body) 5.

As mentioned above, when the semiconductor chip 1 has the vertical channel structure, the semiconductor chip 1 is thinned (a distance between the front surface 1t and the back surface 1b shown in FIG. 7 is made smaller), thereby enabling reduction in on-resistance. In the example shown in FIG. 7, for example, the thickness of the semiconductor chip 1 is in a range of approximately 50 μm to 100 μm.

As shown in FIGS. 6 and 7, the semiconductor device PKG1 has the tab (chip mounting portion) 3 on which the semiconductor chip 1 is mounted. As illustrated in FIG. 7, the tab 3 has an upper surface (chip mounting surface) 3t over which the semiconductor chip 1 is mounted via a conductive bonding material (conductive member) 6, and a lower surface (mounting surface) 3b opposite to the upper surface 3t. As shown in FIG. 6, the tab 3 is integrally formed with a lead 4D. As shown in FIG. 7, the drain terminal 1DT formed at the back surface 1b of the semiconductor chip 1 is electrically coupled to the tab 3 via the conductive bonding material 6.

In the example shown in FIG. 6, the planar size (area of the front surface 1t) of the semiconductor chip 1 is smaller than that (area of an upper surface 3t) of the tab 3. Referring to FIGS. 5 and 7, a lower surface 3b of the tab 3 is exposed from the sealing body 5 at the lower surface 5b of the sealing body 5. When mounting the semiconductor device PKG1 over a mounting substrate (not shown), the exposed surface of the tab 3 is provided with a metal film (exterior plated layer) SD for improving the wettability of solder material as the bonding material.

In this way, the planar size of the tab 3 is increased to expose the lower surface 3b of the tab 3 from the sealing body, which can improve heat dissipation efficiency of heat generated in the semiconductor chip 1. Further, the planar size of the tab 3 is increased to expose the lower surface 3b of the tab 3 from the sealing body, which can reduce the impedance when using the tab 3 as a part of an external terminal.

The conductive bonding material 6 shown in FIGS. 6 and 7 is a conductive member (die-bonding material) for fixing the semiconductor chip 1 over the tab 3 and electrically coupling the semiconductor chip 1 to the tab 3. The conductive bonding material 6 suitable for use can be, for example, a conductive resin material, or a solder material. The conductive resin material is, for example, the so-called silver (Ag) paste that contains conductive particles of a plurality of (number of) silver (Ag) particles and the like in a thermosetting resin.

When mounting the semiconductor device PKG1 on a mounting substrate (not shown) (mother board), for example, a solder material can be used as the bonding material for electrically coupling the leads 4 of the semiconductor device PKG1 to terminals (not shown) on the mounting substrate side. Referring to FIGS. 6 and 7, the metal films SD which are, for example, exterior plated films made of solder are formed at respective bonding surfaces of terminals of the semiconductor device PKG1 in view of improving the wettability of the solder material as the bonding material.

In a step of mounting the semiconductor device PKG1, a heating treatment called a reflow process is performed by melting solder material (not shown) to bond the leads 4 to the respective terminals on the mounting substrate side (not shown). When using the conductive adhesive containing conductive particles mixed in the resin as the conductive bonding material 6, even if the processing temperature of the reflow process is arbitrarily set, the conductive bonding material is not melted. Thus, the conductive bonding material 6 of the bonding portion between the semiconductor chip 1 and the tab 3 is preferable in terms of preventing inconveniences that would be caused by remelting when mounting the semiconductor device PKG1.

On the other hand, when using the solder material as the conductive bonding material 6 for bonding the semiconductor chip 1 to the tab 3, the solder material having a higher melting point than that of the bonding material during mounting is preferably used to suppress the remelting in mounting the semiconductor device PKG1. Thus, the selection of material is limited in using the soldering material for the conductive bonding material 6 as the die-bonding material. However, the use of the solder material is more preferable in view of improving the electric coupling reliability, compared to the use of the conductive adhesive.

As shown in FIGS. 5 and 6, the tab 3 is supported by suspension leads TL. The suspension lead TL is a supporting member for fixing the tab 3 at the frame portion of the lead frame in the manufacturing process of the semiconductor device PKG1.

As illustrated in FIGS. 6 and 7, the source terminal 1ST of the semiconductor chip 1 is electrically coupled to a lead 4S via a metal clip (conductive member, metal plate) 7. The metal clip 7 is made, for example, of copper (Cu). The metal clip 7 is electrically coupled to the source terminal 1ST of the semiconductor chip 1 via a conductive bonding material 8. The metal clip 7 is electrically coupled to the lead 4S via the conductive bonding material 8.

The conductive bonding material 8 shown in FIGS. 6 and 7 is a conductive member for fixing the metal clip 7 over the lead 4S and the source terminal 1ST of the semiconductor chip 1 and electrically coupling the semiconductor chip 1 to the metal clip 7 as well as coupling the lead 4S to the metal clip 7. The conductive bonding material 8 suitable for use can be, for example, a conductive resin material, or a solder material. The conductive resin material is, for example, the so-called silver (Ag) paste that contains conductive particles of a plurality of (number of) silver (Ag) particles and the like in a thermosetting resin.

As shown in FIG. 6, a lead 4G is disposed as an external terminal electrically coupled to the gate terminal 1GT of the semiconductor chip 1, adjacent to the tab 3. The lead 4G is spaced apart from the tab 3. The lead 4G is electrically coupled to the gate terminal 1GT via a wire (conductive member) 9 which is a metal fine wire.

As shown in FIG. 7, respective parts of the semiconductor chip 1, the metal clip 7, and the leads 4 are sealed with the sealing body 5. A part of the lead 4G shown in FIG. 6 and the wire 9 are sealed with the sealing body 5.

The sealing body 5 is a resin body for sealing the plurality of semiconductor chips 1, the metal clips 7, and the wires 9. The sealing body 5 has an upper surface 5t (see FIGS. 4 and 7) and a lower surface (mounting surface) 5b (see FIGS. 5 and 7) positioned opposite to the upper surface 5t.

This embodiment has described above the semiconductor chip 1 including the MOSFET and the semiconductor device PKG1 as a semiconductor package with the semiconductor chip 1 mounted thereon by way of example. There are various modified examples of semiconductor devices to which the technique described below can be applied. For example, the element (circuit) in the semiconductor chip 1 may include, in addition to a transistor, an element such as a diode. For example, a number of terminals may be formed at the front surface 1t of the semiconductor chip 1. A semiconductor package, for example, having the semiconductor chip mounted over a wiring substrate may be used. In some cases, distribution systems for the semiconductor devices include a step of forming a plurality of circuits in a semiconductor wafer and another step of separating (singulation) of the semiconductor wafer into individual chip regions; these steps are performed at different business facilities, or by different operators. In this case, the semiconductor wafer before the singulation can also be regarded as the semiconductor device.

<Method of Manufacturing Semiconductor Device>

Figure 8:
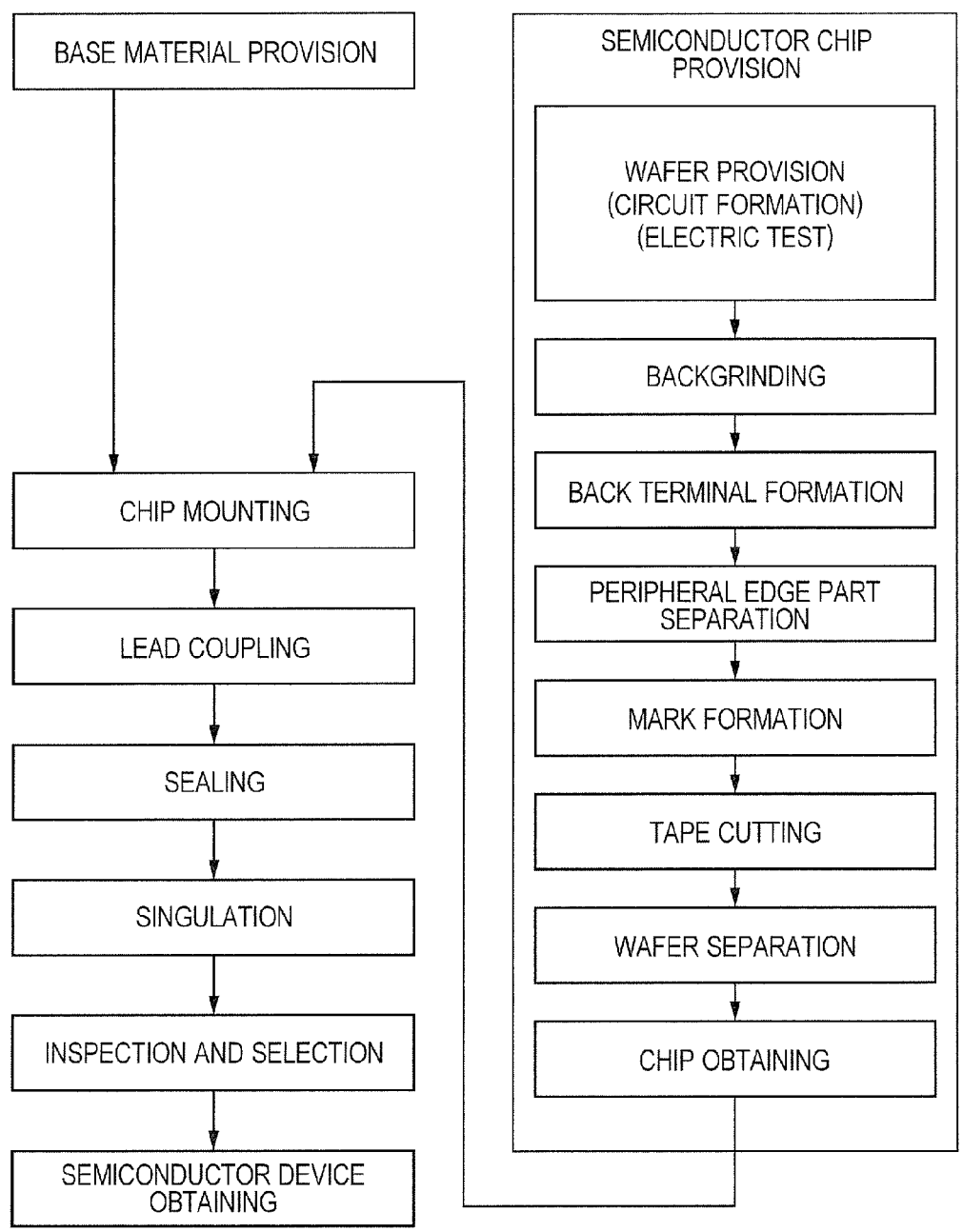
FIG. 8 is an explanatory diagram showing the outline of a manufacturing procedure for the semiconductor device according to the one embodiment.

Next, a method of manufacturing a semiconductor device in this embodiment will be described. The semiconductor device PKG1 shown in FIGS. 4 to 7 is manufactured along the flow shown in FIG. 8. FIG. 8 is an explanatory diagram showing the outline of manufacturing steps for the semiconductor device in this embodiment.

<Semiconductor Chip Provision Step>

First, a semiconductor chip provision step shown in FIG. 8 will be described. As shown in FIG. 8, the semiconductor chip provision step includes: a wafer provision step, a backgrinding step, a back terminal formation step, a peripheral edge part separation step, a mark formation step, a tape cutting step, a wafer separation step, and a chip obtaining step.

<Wafer Provision Step>

Figure 9:
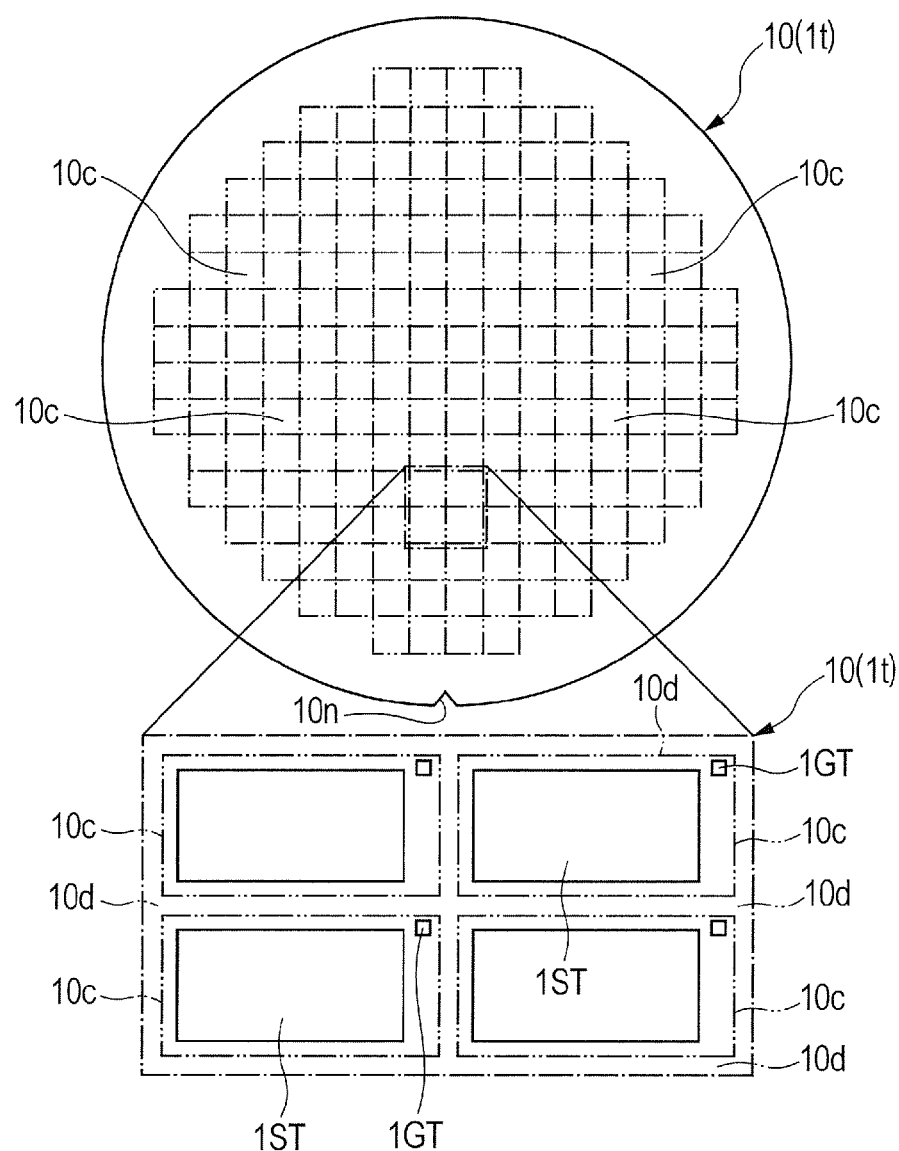
FIG. 9 is a plan view showing the plane at a main surface side of a semiconductor wafer provided in a wafer provision step shown in FIG. 8.
Figure 10:
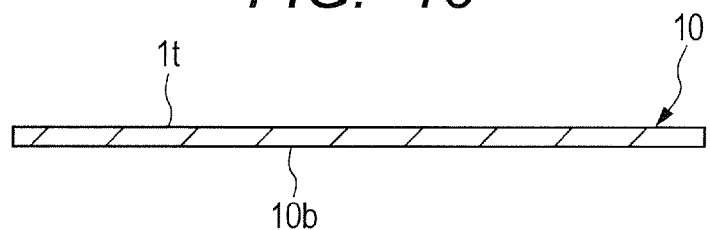
FIG. 10 is a cross-sectional view of the semiconductor wafer shown in FIG. 9.

In a wafer provision step, as shown in FIGS. 9 and 10, a wafer (semiconductor wafer) 10 is provided. FIG. 9 is a plan view showing the plane on a main surface side of a semiconductor wafer that is provided in the wafer provision step shown in FIG. 8. FIG. 10 is a cross-sectional view of the semiconductor wafer shown in FIG. 9.

The wafer 10 is formed in a substantially circular planar shape and has a front surface (surface, upper surface) 1t and a back surface (surface, lower surface) 10b (see FIG. 10) positioned opposite to the front surface 1t. For example, in this embodiment, the wafer 10 shown in FIGS. 9 and 10 has a diameter of 200 mm and a thickness of 770 µm. Note that the front surface 1t of the wafer 10 corresponds to the front surface 1t of the semiconductor chip 1 shown in FIG. 7. The wafer 10 includes a plurality of chip regions 10c formed at the front surface 1t thereof, and dicing regions 10d formed between the adjacent ones of the chip regions 10c. Each of the chip regions 10c corresponds to the semiconductor chip 1 explained using FIGS. 1 to 3. The source terminal 1ST and the gate terminal 1GT are formed at the front surface 1t. A notch 10n serving as a mark for identifying the direction of the plane of the wafer 10 is formed at the peripheral edge part of the wafer 10.

The wafer provision step shown in FIG. 8 includes a step of forming a circuit (integrated circuit) including a semiconductor element, such as a MOSFET, described using FIG. 3 (circuit formation step), and a step of performing an electric test to ascertain the electric characteristics of the circuit (electric test step). Note that the drain terminal 1DT shown in FIG. 3 is formed after the backgrinding step of FIG. 8. The electric test step can also be performed before forming the drain terminal 1DT. When intending to perform the electrical test step after forming the drain terminal 1DT, the electrical test step may be performed after the backgrinding surface.

<Backgrinding Step>

Figure 11:
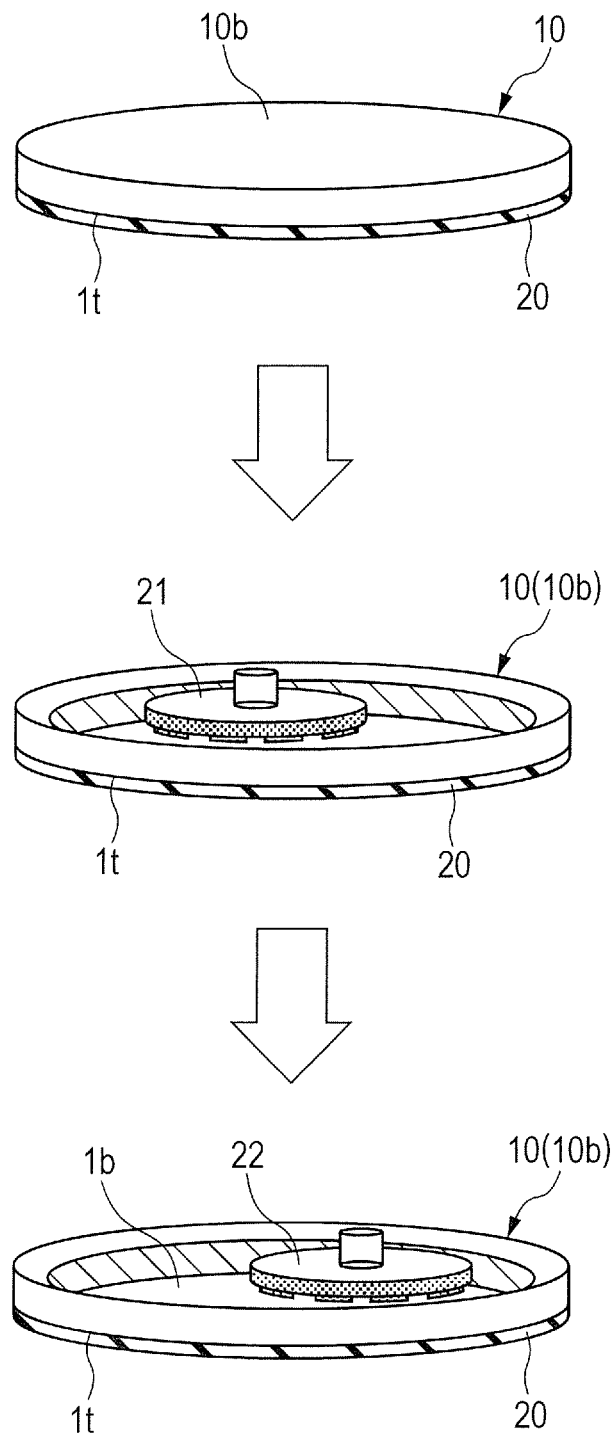
FIG. 11 is a schematic explanatory diagram showing a flow of a backgrinding process shown in FIG. 8.
Figure 12:
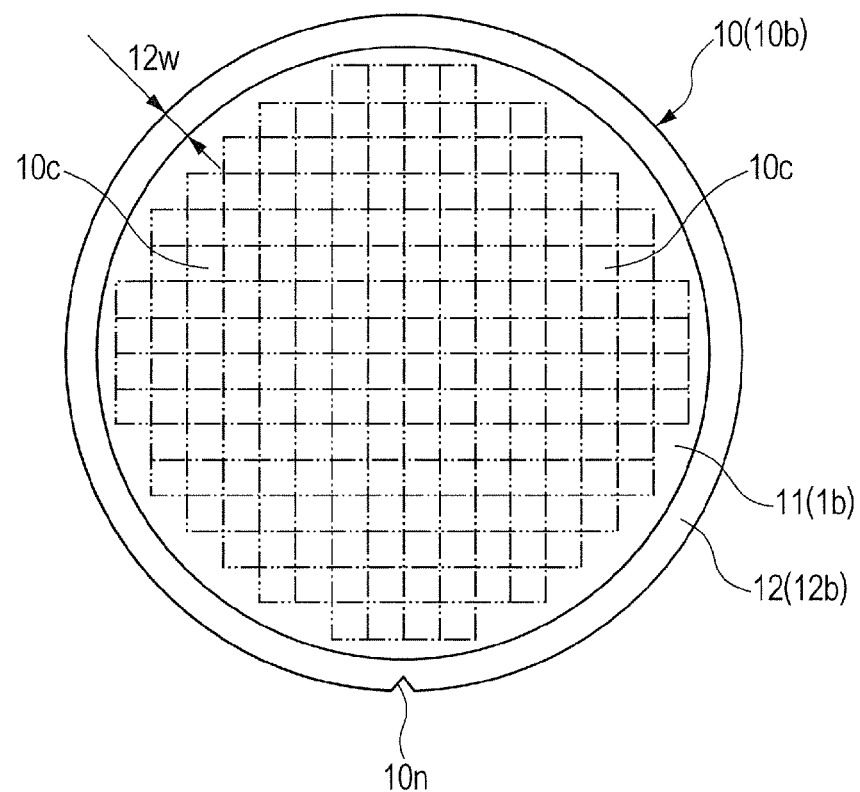
FIG. 12 is a plan view of the back surface of the wafer after the backgrinding process.
Figure 13:
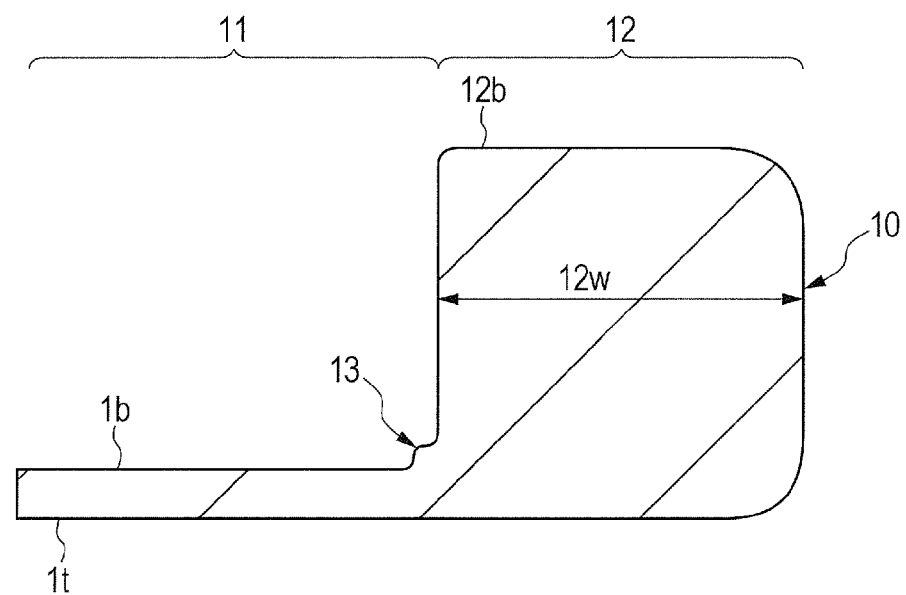
FIG. 13 is an enlarged cross-sectional view of the vicinity of a peripheral edge part of the wafer shown in FIG. 12.

Then, as shown in FIGS. 11 and 12, the backgrinding step involves grinding the back surface 10b of the wafer 10 (see FIG. 11) to expose the back surface 1b (see FIGS. 12 and 13) positioned at the side of the front surface 1t rather than the back surface 10b. FIG. 11 is a schematic explanatory diagram showing a flow of the backgrinding step shown in FIG. 8. FIG. 12 is a plan view of the back surface side of the wafer after the backgrinding step. FIG. 13 is an enlarged cross-sectional view of the vicinity of a peripheral edge part of the wafer shown in FIG. 12.

In this step, the back surface 10b side of the wafer 10 is ground until the thickness of the wafer 10 reaches the thickness (for example, 50 µm) of the semiconductor chip 1 shown in FIG. 7 (up to the position of the back surface 1b shown in FIG. 13). Another method of obtaining a thin semiconductor chip 1 can also be proposed which involve previously thinning the semiconductor substrate (silicon wafer in this embodiment) serving as the base material. When excessively thinning the thickness of the semiconductor substrate, the handleability of the substrate is degraded in the wafer provision step shown in FIG. 8, which might break the wafer. The thinned wafer would cause the warpage and deformation thereof in some cases, thus reduced the machining accuracy.

In the wafer provision step and the wafer fixing step of this embodiment, processing is performed on a wafer having a first sufficient thickness (e.g., in a range of 700 µm to 800 µm) from the viewpoint of suppressing the degradation in handleability or suppressing the warpage and deformation. Then, the back surface 10b (see FIG. 10) is ground to reduce the thickness of the wafer (e.g., to 50 µm). This method can make the obtained semiconductor chip 1 (see FIG. 7) thinned while preventing the breakage of the wafer in each step of the backgrinding process (for example, a circuit formation step and the like shown in FIG. 8).

If in the backgrinding step, the entire back surface 10b of the wafer 10 shown in FIG. 10 is simply ground to produce the wafer 10 of 100 µm or less in thickness as a whole, the handleability of the wafer 10 is degraded between the backgrinding step and the wafer separation step. The occurrence of warpage in the wafer 10 would cause degradation in machining accuracy in the wafer separation step.

In this embodiment, in the backgrinding step, a center part (device region, first part) 11 with the chip regions 10c in the back surface 10b of the wafer 10 shown in FIG. 12 is selectively ground to be thinned. Specifically, in a planar view, the wafer 10 has the center part 11 with the chip regions 10c formed therein, and a peripheral edge part (second part) 12 continuously surrounding the center part 11. No chip region 10c is provided in the peripheral edge part 12. In the backgrinding step of this embodiment, as shown in FIGS. 12 and 13, the back surface 10b of the wafer 10 is ground such that the center part 11 is thinner than the peripheral edge part 12. For example, in an example shown in FIG. 13, the thickness of the center part 11, that is, the distance from the front surface 1t to the back surface 1b is 50 µm. On the other hand, the thickness of the peripheral edge part 12, that is, the distance from the front surface 1t to the back surface 12b is approximately 650 µm.

As shown in FIG. 12, a width 12w of the peripheral edge part 12 except for a part with the notch 10n is constantly set to the same value around its entire periphery. In an example shown in FIGS. 12 and 13, the width 12w is in a range of approximately 2 mm to 2.5 mm.

In this way, the peripheral edge part 12 around the center part 11 is thickened and thus functions as a reinforcing member for suppressing the warpage and deformation of the wafer 10. Therefore, this embodiment can suppress the warpage and deformation of the wafer 10 in a step performed after decreasing the thickness of the wafer 10 to 100 µm or less.

Now, the details of the backgrinding process in this embodiment will be described with reference to FIG. 11. In this process, first, as shown in an upper stage of FIG. 11, a backgrinding tape 20 is attached to the surface of the wafer 10. The backgrinding tape 20 is a protective tape for preventing contamination of a circuit formed at the front surface 1t side due to grinding chips from the wafer, cleaning water, etc., in the backgrinding process. The backgrinding tape 20 has an adhesive layer formed at one side of a resin film as a base material. The surface with the adhesive layer formed thereat is bonded to the front surface 1t of the wafer 10.

Then, although not shown in FIG. 11, the entire back surface 10b of the wafer 10 is ground to a thickness of approximately 50 µm to 100 µm with the backgrinding tape 20 being attached thereto (preliminary grinding step). In the preliminary grinding step, the grinding is continuously performed until the back surface 12b shown in FIG. 13 is exposed, thereby producing the wafer 10 having its entire thickness of approximately 650 µm. Note that the preliminary grinding step may be substantially omitted.

Then, as shown in an intermediate stage of FIG. 11, the back surface 10b of the wafer 10 is ground using a grinding stone (grinding jig) 21 while the backgrinding tape 20 is attached (in a rough grinding step). In this step, the center part 11 is selectively ground until its thickness shown in FIGS. 12 and 13 reaches a predetermined thickness (for example, approximately 60 µm).

Then, as shown in a lower stage of FIG. 11, the back surface 10b of the wafer 10 is ground using a grinding stone (grinding jig) 22 different from the grinding stone 21 while the backgrinding tape 20 is attached, thereby exposing the back surface 1b (finish grinding step). In this step, the center part 11 shown in FIGS. 12 and 13 is selectively ground until the thickness of the center part 11 reaches a target value (for example, 50 µm) in terms of design. The grinding stone 21 differs from the grinding stone 22 in size of abrasive grains. The grain size of the abrasive grain included in the grinding stone 22 is smaller than that included in the grinding stone 21. In other words, the grain size of the abrasive grain included in the grinding stone 21 is larger than that included in the grinding stone 22.

In this way, the wafer is ground with the grinding stone 21 having a large grain size until just before the target thickness in terms of design is reached, thereby enabling reduction in grinding process time. On the other hand, the back surface 1b is exposed with the grinding stone 22 having a small grain size, so that the flatness of the back surface 1b can be improved. The flatness of the back surface 1b affects the electric characteristics of the semiconductor chip 1 shown in FIG. 3, thereby improving the flatness of the back surface 1b, whereby the electric characteristics of the semiconductor chip 1 can be stabilized.

Like this embodiment, when a finish grinding step is performed after a rough grinding step, a stepped portion 13 is formed at the boundary between the center part 11 and the peripheral edge part 12 as show in FIG. 13. A difference in height of the stepped portion 13 is, for example, in a range of approximately several µm to 10 µm, which is thinner than the center part 11.

Note that after this step, a cleaning work of the wafer 10 is performed to remove the grinding chips or grinding solution attached to the wafer 10. At this time, the backgrinding tape 20 is peeled off the front surface 1t of the wafer 10 shown in FIG. 11, and then the front surface 1t of the wafer 10 is also cleaned. If the wafer 10 is thin as a whole, warpage tends to occur in the wafer 10 when the backgrinding tape 20 is peeled off. In this embodiment, however, as shown in FIG. 12, the peripheral edge part 12 having twice or more as thick as the center part 11 (for example, 650 µm in thickness) is provided around the center part 11 with the chip regions 10c provided therein. Thus, even if the backgrinding tape 20 is peeled off, the wafer 10 can be prevented from being warped.

The thicker the peripheral edge part 12, the better it is in view of preventing the warpage of the wafer 10. If the width 12w of the peripheral edge part 12 shown in FIG. 12 is widened, the thickness of the peripheral edge part 12 may be less than twice as large as that of the center part 11. However, an increase in width 12w results in a decrease in area of the center part 11, or effective area for the chip regions 10c, whereby the number of semiconductor chips 1 (see FIG. 1) obtainable from one wafer 10 is decreased. Therefore, from the viewpoint of increasing the number of semiconductor chips 1 obtainable from one wafer 10 thereby improving the manufacture efficiency thereof, the peripheral edge part 12 is preferably twice or more as thick as the center part 11. When the thickness of the center part 11 is 100 µm or less, like this embodiment, the peripheral edge part 12 is more preferably five times or more as thick as the center part 11.

The planar shape (shape of the back surface 1b shown in FIG. 12) of the center part 11 is circular. In view of suppressing the warpage and deformation of the wafer 10, the planar shape of the center part 11 is not limited to a circular one, but can take various modified shapes, for example, a polygonal shape. Note that since the planar shape of the wafer 10 is generally circular, the planar shape of the center part 11 is preferably circular as shown in FIG. 12 from the viewpoint of maximizing the area of the back surface 1b of the center part 11.

<Back Terminal Formation Step>

Figure 14:
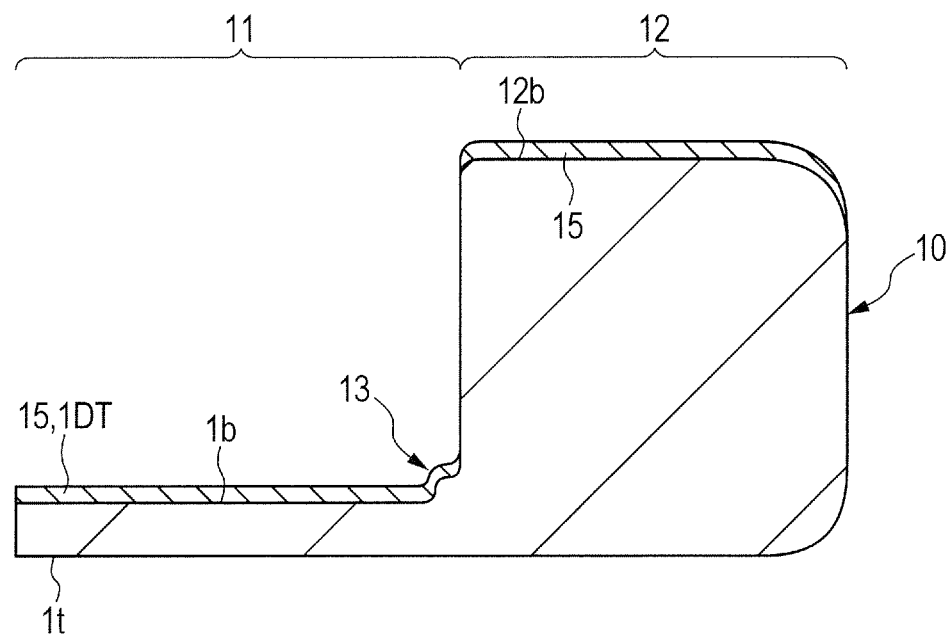
FIG. 14 is an enlarged cross-sectional view showing a state of forming a metal film on the back surface of the wafer shown in FIG. 13.

Then, in the back terminal formation step shown in FIG. 8, as shown in FIG. 14, a metal film 15 is formed over the back surface 1b and back surface 12b of the wafer 10. FIG. 14 is an enlarged cross-sectional view showing the state of forming the metal film on the side of the back surface of the wafer shown in FIG. 13.

The metal film 15 shown in FIG. 14 is, for example, a laminated film made of titanium (Ti) and gold (Au). The metal film 15 is formed by laminating a titanium film and a gold film in this order, for example, by sputtering. The metal film 15 is a metal film forming the drain terminal 1DT shown in FIGS. 3 and 7. In this step, the metal film 15 is formed to cover the entire back surface 1b, so that the drain terminals 1DT (see FIG. 7) in the chip regions 10c shown in FIG. 12 can be collectively formed.

In this embodiment, the metal film 15 (see FIG. 14) is provided as the drain terminal 1DT from the viewpoint of improving the electric characteristics of the semiconductor chip 1 (see FIG. 3) or improving the bonding properties between the conductive bonding material 6 and the semiconductor chip 1 shown in FIG. 7. Note that in a modified example corresponding to this embodiment, the metal film 15 is not provided in some cases.

When forming the metal film 15 at one surface of the wafer 10 in this embodiment, if the thickness of the peripheral edge part 12 of the wafer 10 is substantially the same as that of the center part 11, the warpage and deformation of the wafer 10 would be caused. In this embodiment, however, as mentioned above, the peripheral edge part 12 is thicker than the center part 11, so that the warpage and deformation of the wafer 10 can be prevented even if the metal film 15 is formed.

<Peripheral Edge Part Separation Step>

Figure 15:
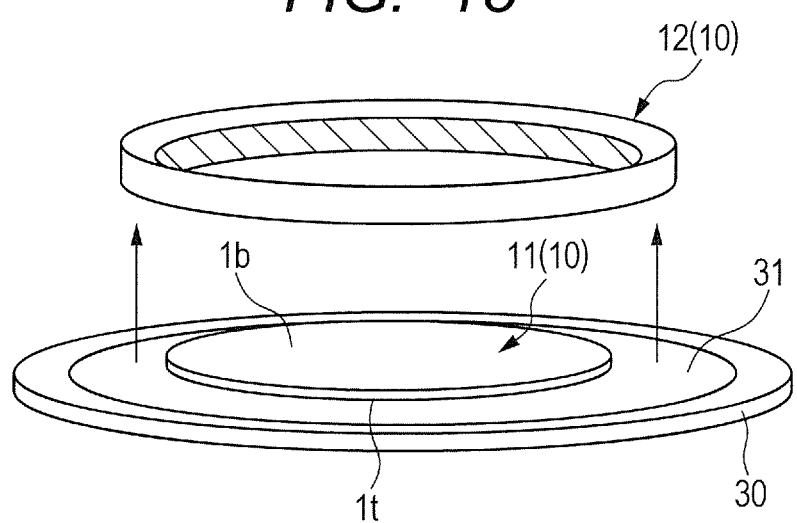
FIG. 15 is a schematic perspective view showing a state in which the peripheral edge part of the wafer shown in FIG. 14 is separated from the center part thereof and then removed therefrom.
Figure 16:
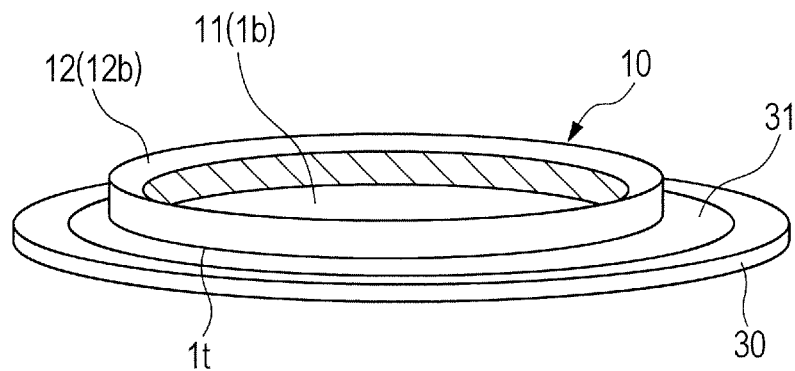
FIG. 16 is a perspective view showing a state of fixing the wafer shown in FIG. 14 to a fixing ring via a holding tape.
Figure 17:
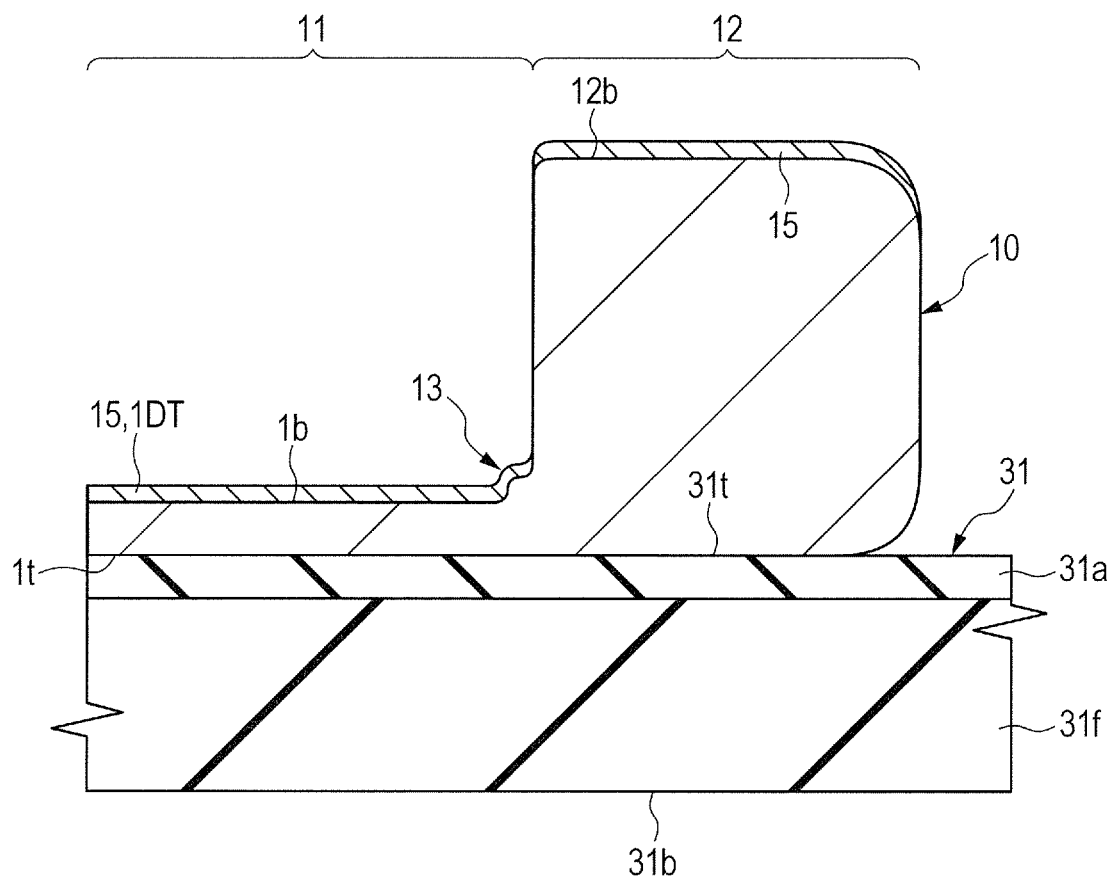
FIG. 17 is an enlarged cross-sectional view of the vicinity of a peripheral edge part of the wafer shown in FIG. 16.
Figure 18:
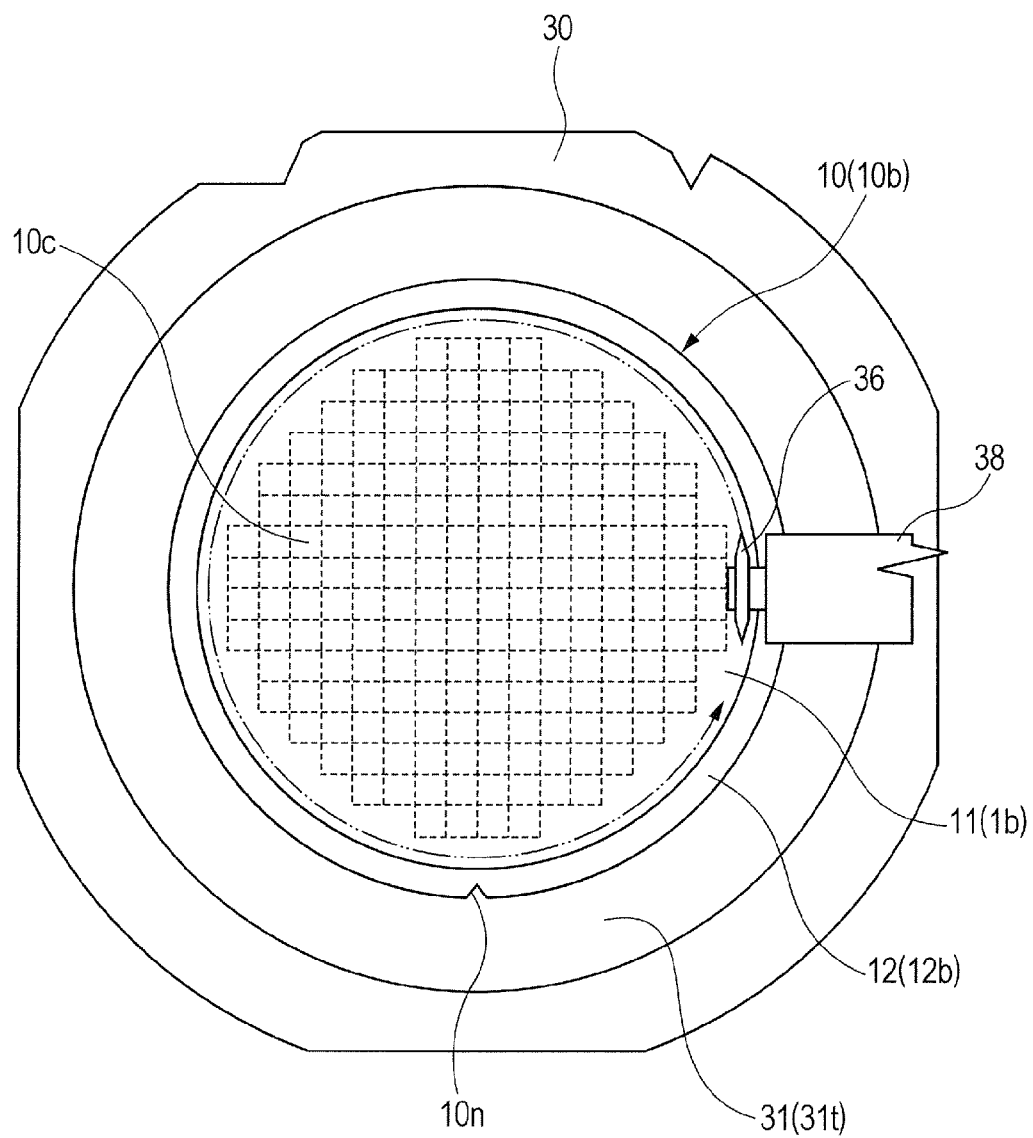
FIG. 18 is a plan view showing a step of cutting the vicinity of a boundary between the center part and the peripheral edge part of the wafer shown in FIG. 17 in a ring-like shape.
Figure 19:
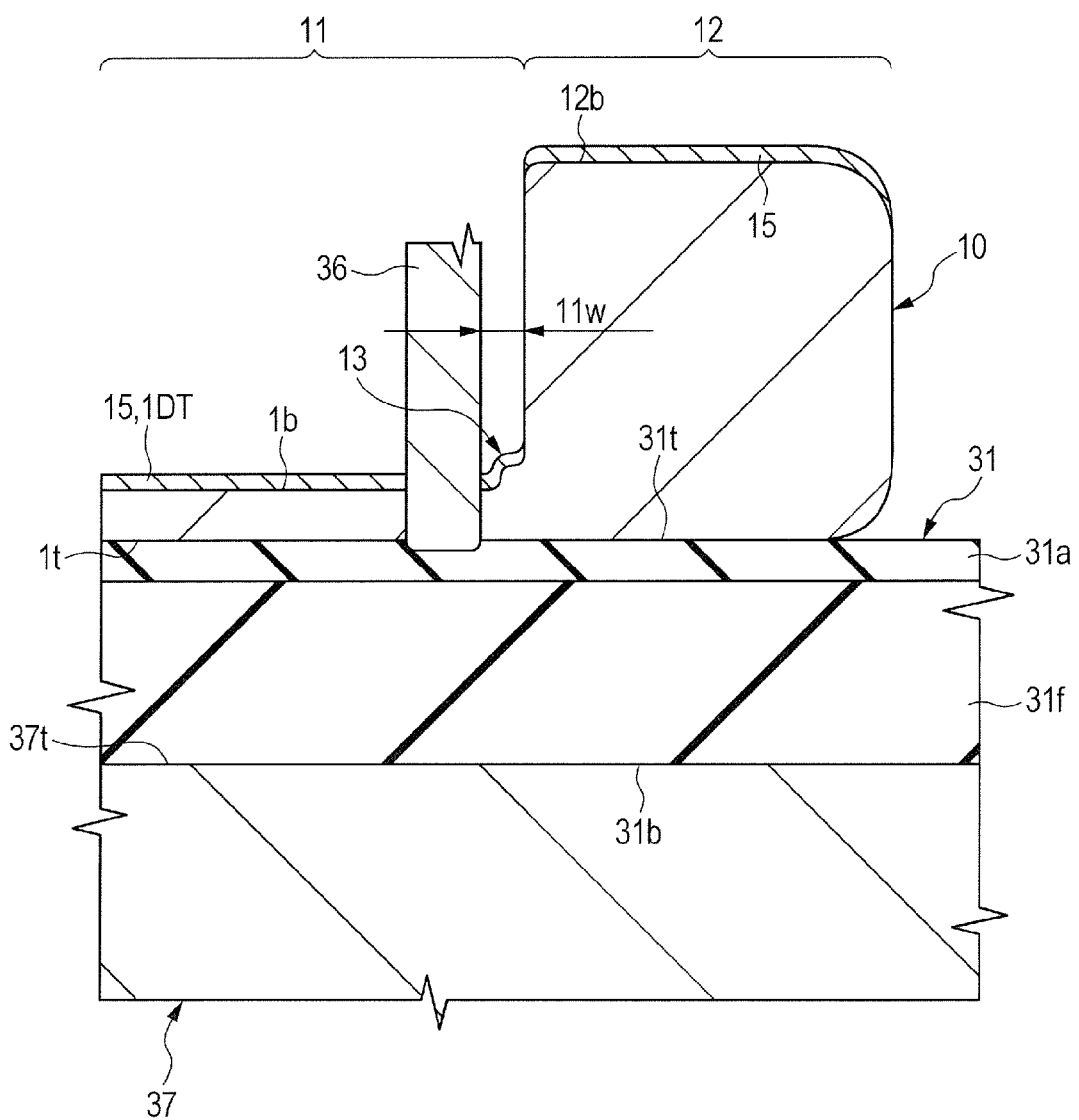
FIG. 19 is an enlarged cross-sectional view showing a state in which a part of the wafer is cut with a blade shown in FIG. 18.
Figure 20:
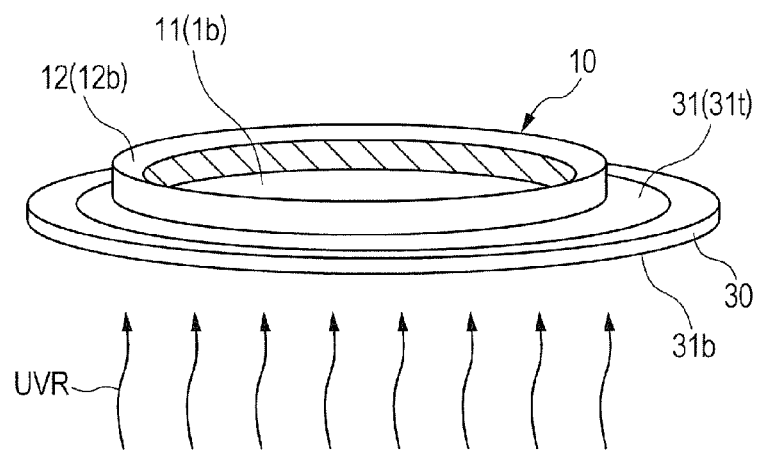
FIG. 20 is a perspective view showing a state of irradiating the holding tape shown in FIG. 19 with UV rays.
Figure 21:
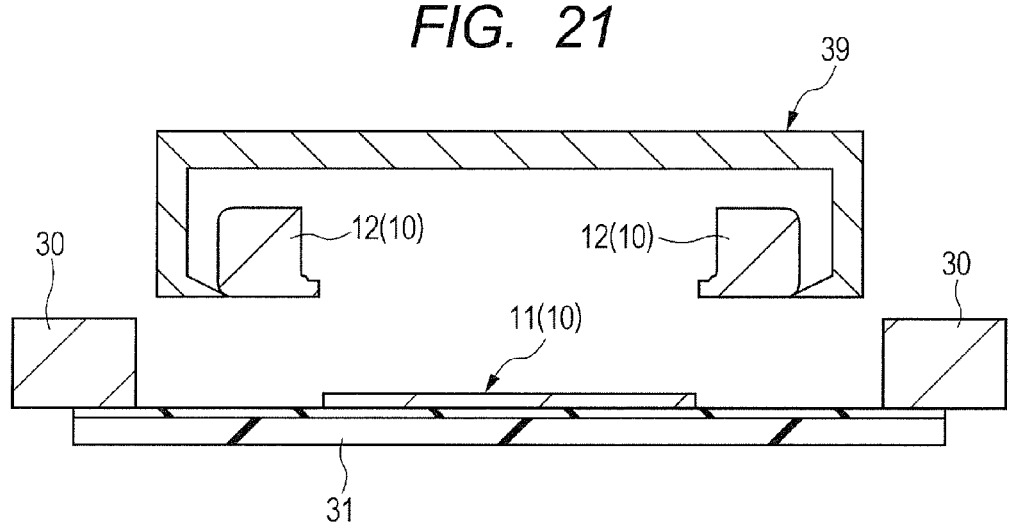
FIG. 21 is a cross-sectional view showing a state in which the peripheral edge part of the wafer is peeled off and removed from the holding tape shown in FIG. 20.

Then, in the peripheral edge part separation step shown in FIG. 8, as shown in FIG. 15, the center part 11 of the wafer 10 is cut and separated from the peripheral edge part 12 thereof. FIG. 15 is a schematic perspective view showing a state in which the peripheral edge part of the wafer shown in FIG. 14 is separated from the center part thereof and then removed therefrom. FIG. 16 is a perspective view showing a state of fixing the wafer shown in FIG. 14 to a fixing ring via a holding tape. FIG. 17 is an enlarged cross-sectional view of the vicinity of a peripheral edge part in the wafer shown in FIG. 16. FIG. 18 is a plan view showing a step of applying a cutting process to and cutting of the vicinity of a boundary between the center and peripheral edge part of the wafer shown in FIG. 17 in a ring-like shape. FIG. 19 is an enlarged cross-section view showing a state of cutting a part of the wafer with the blade shown in FIG. 18. FIG. 20 is a perspective view showing a state of irradiating a holding tape shown in FIG. 19 with UV rays. FIG. 21 is a cross-sectional view of peeling off and removing the peripheral edge part of the wafer from the holding tape shown in FIG. 20.

Note that in FIG. 18, to easily distinguish the boundary lines between the chip regions 10c and the traveling direction of a blade 36, dicing regions are indicated by dotted lines, and arrows showing the traveling direction of the blade 36 are indicated by dashed-two dotted lines.

In the peripheral edge part separation step, to previously separate the center part 11 of the wafer 10 from its peripheral edge part 12, as shown in FIG. 16, the holding tape 31 is attached to the wafer 10, and then the wafer 10 is fixed to a fixing ring (support member) 30 via the holding tape 31 (holding tape attachment step).

The fixing ring 30 is a supporting member for delivering and fixing the wafer 10 onto a working stage in the peripheral edge part separation step, for example, a ring-like metal member. The holding tape 31 is a resin film that is attached to the fixing ring 30 in a tense manner. As shown in FIG. 17, one surface of the resin base material 31f is covered with an adhesive layer 31a. In the upper surface 31t and lower surface 31b of the holding tape 31, the upper surface 31t with the adhesive layer 31a formed thereon serves as a bonding surface of the holding tape 31.

Figure 29:
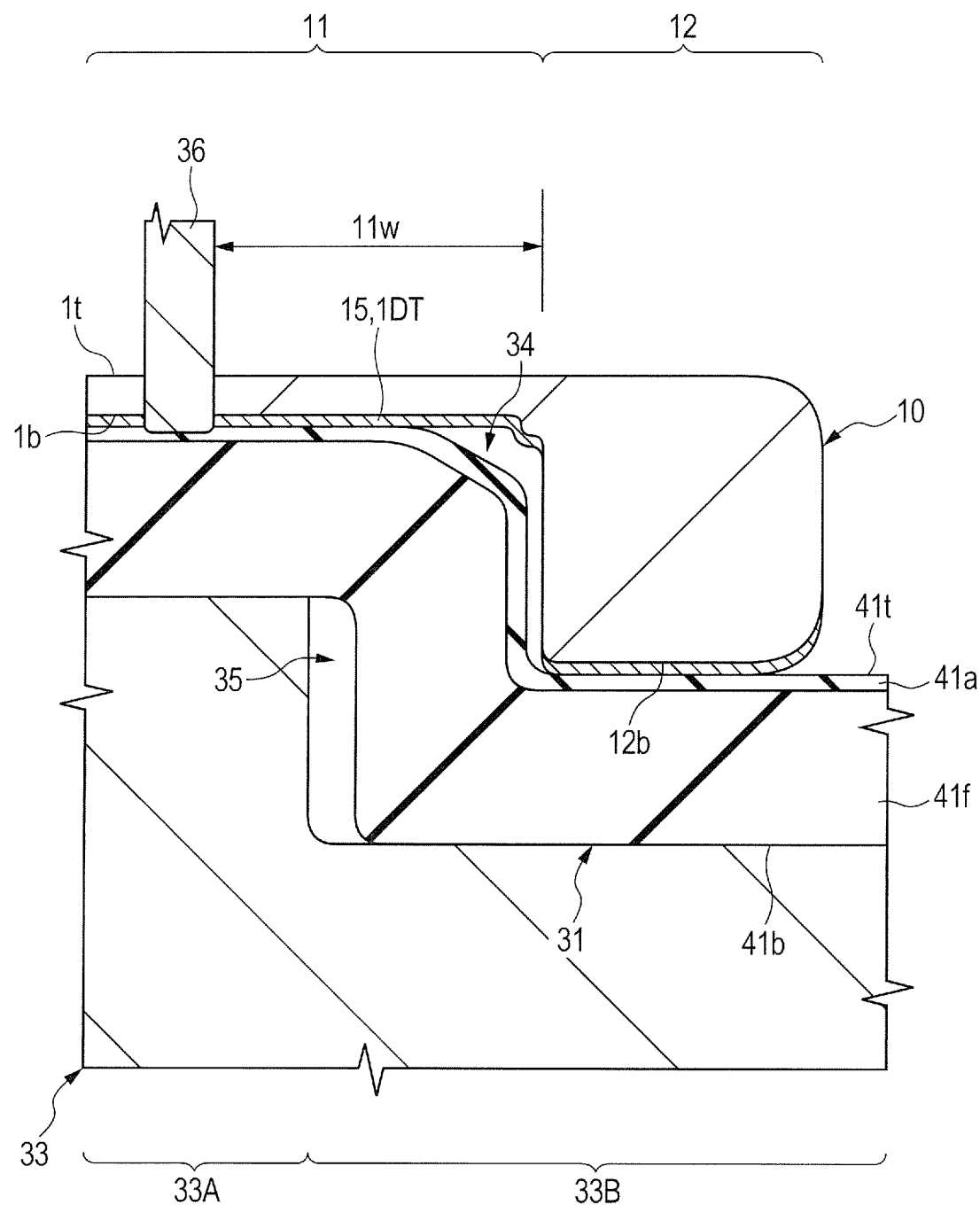
FIG. 29 is an enlarged cross-sectional view showing a considered example corresponding to FIG. 19.

In the peripheral edge part separation step, as shown in FIG. 18 to be described later, the vicinity of the boundary between the center part 11 and the peripheral edge part 12 shown in FIG. 17 is subjected to the cutting process in a ring-like shape using the blade 36, which is a rotary blade with abrasive grains fixed to its peripheral edge, whereby the periphery of the center part 11 is cut in a circular shape. When applying the cutting process to the wafer using the blade, generally, like a considered example shown in FIG. 29, a holding tape 41 called a dicing tape is attached to the back surface 1b side of the wafer 10, and then the cutting process is performed on the wafer with the blade 36 in contact with the front surface 1t side. FIG. 29 is an enlarged cross-sectional view showing the considered example corresponding to FIG. 19.

Here, when the peripheral edge part 12 is thicker than the center part 11, like the wafer 10, in this embodiment, the back surface 1b and the back surface 12b differ in height from each other. In this case, to prevent the wafer 10 from being damaged during the cutting process with the blade 36, the center part 11 and the peripheral edge part 12 of the wafer 10 need to be respectively supported. For this reason, as shown in FIG. 29, during the cutting process with the blade 36, a stage 33 supporting the wafer 10 needs to have a part 33A disposed directly under the center part 11, and a part 33B disposed directly under the peripheral edge part 12, with the part 33A being protruded with respect to the part 33B.

However, based on the studies by the inventors of the present application, as shown in FIG. 29, it is found that the following points should be considered when performing the cutting process on the wafer 10 from the side of its front surface 1t. In attaching the holding tape 41 to the back surfaces 1b and 12b of the wafer 10, a gap 34 is more likely to occur between the wafer 10 and the holding tape 41 in the boundary between the center part 11 and the peripheral edge part 12 due to the presence of a stepped portion caused by the difference in thickness between the center part 11 and the peripheral edge part 12. Similarly, a gap 35 is more likely to occur between the stage 33 and the holding tape 41 due to the presence of a stepped portion caused by a difference in height between the part 33A and the part 33B of the stage 33.

Thus, the position of the center part 11 in the wafer 10 where the cutting process is applied with the blade 36 needs to be set taking the gaps 34 and 35 into consideration. That is, as shown in FIG. 29, the width 11w of a part that is separated from the center part 11 and cut together with the peripheral edge part 12 should be set large. This results in small effective area of the device region in the center part 11 shown in FIG. 12 where the chip regions 10c can be formed. Then, the decrease in effective area of the device region might reduce the number of semiconductor chips 1 (see FIG. 1) obtainable from one piece of wafer 10, reducing the manufacturing efficiency.

Furthermore, the protruding degree of the part 33A included in the stage 33 shown in FIG. 29 should be changed according to the difference in height between the back surfaces 1b and 12b of the wafer 10. Since a base material 41f of the holding tape 41 is made of a resin film, if a difference in height between the back surfaces 1b and 12b is a slight error or so caused due to the machining accuracy, such an error can be allowed by elastic deformation of the holding tape 41. However, when processing a plurality of kinds of products with difference thicknesses in design, the kind of the stage 33 must be changed for each product in order to surely make the parts 33A and 33B stick respectively to the holding tape 41. In this case, the device must be changed every time the kind of product is changed, which would cause the reduction in manufacturing efficiency.

Thus, the inventors of the present application have found out the present embodiments by considering the aforesaid points. That is, as shown in FIG. 17, in this embodiment, in a holding tape attachment step, the holding tape 31 is attached to the wafer 10 such that the front surface 1t of the wafer 10 faces the upper surface 31t as the bonding surface of the holding tape 31. In other words, in this embodiment, the holding tape 31 is attached to the front surface 1t side of the wafer 10. Thus, as shown in FIG. 19, in this embodiment, when performing the cutting process with the blade 36, the wafer 10 may be supported by a stage 37 with the flat supporting surface 37t, regardless of a difference in height between the back surface 1b and the back surface 12b of the wafer 10. In this embodiment, the center part 11 and the peripheral edge part 12 can be surely supported without causing the gaps 34 and 35 shown in FIG. 29.

Thus, in this embodiment, a part of the center part 11 in the wafer 10 to be in contact with the blade 36 can be positioned close to the boundary with the peripheral edge part 12. In other words, as shown in FIG. 19, the width 11w of a part of the center part 11 cut and separated from the peripheral edge part 12 can be made small, compared to FIG. 29. As a result, the effective area of the device region in the center part 11 shown in FIG. 12 in which the chip regions 10c can be provided can be increased. The effective area of the device region can be made larger, thus increasing the number of semiconductor chips 1 (see FIG. 1) obtainable from one piece of wafer 10, improving the manufacturing efficiency.

As mentioned above, the stage 37 of this embodiment has a flat supporting surface 37t, regardless of a difference in height between the back surface 1b and the back surface 12b of the wafer 10. Thus, the manufacturing efficiency can be improved without switching the stage 37 depending on the kind of product.

As shown in FIG. 17, when attaching the holding tape 31 to the front surface 1t of the wafer 10, the adhesive layer 31a needs to be brought into intimate contact with the wafer, depending on the shapes of a plurality of terminals (the source terminal 1ST or the gate terminal 1GT shown in FIG.

9) formed at the front surface 1t. Thus, in this step, the adhesive layer 31a of the holding tape 31 to be attached to the wafer 10 is thicker than the adhesive layer 41a of the holding tape 41 shown in FIG. 29. For example, the thickness of the adhesive layer 31a is in a range of approximately 20 µm to 40 µm. On the other hand, the thickness of the adhesive layer 41a shown in FIG. 29 is in a range of approximately 5 µm to 10 µm. Note that the holding tape 41 shown in FIG. 29 is used for the purpose of holding the wafer 10 in a wafer separation step to be described later.

In the peripheral edge part separation step, after the holding tape attaching step described above, as shown in FIGS. 18 and 19, a part of the center part 11 is cut in the ring-like shape by the blade (rotary blade) 36 with the wafer 10 being held by the holding tape 31, thereby cutting and separating the center part 11 from the peripheral edge part 12 (circle cutting step).

In the circle cutting step, as shown in FIG. 18, the blade 36 attached to the rotary shaft of the spindle 38 is rotated to perform the cutting process on the center part 11 of the wafer 10. As mentioned above, since in this embodiment, the blade 36 is brought into contact with the wafer 10 from the back surface 1b side, the cutting process can be applied to the vicinity of the boundary between the center part 11 and the peripheral edge part 12. The blade 36 is a cutting jig (rotary blade) with a plurality of abrasive grains made of diamond or the like and attached to the outer periphery of a thin plate with a substantially circular outer shape. The blade 36 serves to perform the cutting process on an object to be cut, with the abrasive grains fixed to its outer periphery by rotating the thin plate, to thereby cut the object.

In this embodiment shown in FIG. 18, in the circle cutting step, the cutting process is performed such that a cut line forms a circular track. Specifically, in the circle cutting step, the position of the blade 36 is moved to draw a concentric circuit with respect to the circle forming the outer edge of the wafer 10. In the circle cutting step, the position of the blade 36 is moved while rotating the blade 36 in such a manner that the arc is drawn along the outer edge of the center part 11.

In this step, the vicinity of the boundary between the center part 11 and the peripheral edge part 12 is cut, so that the area of the center part 11 can be maximized. Thus, the shape of the cutting line is not limited to a circular one and may be any shape as long as it is formed along the outer edge of the center part 11. For example, when the planar shape of the center part 11 is polygonal, the shape of the cutting line may be polygonal.

Note that if a part of the peripheral edge part 12 is singulated in the circle cutting step, the part might become foreign matter. Thus, like this embodiment, the shape of the cutting line is preferably circle from the viewpoint of cutting the wafer to prevent the peripheral edge part 12 from being singulated. When the shape of the center part 11 and the shape of the cutting line are circular, the effective area where the chip regions 10c are provided can be maximized in the center part 11 of the wafer 10 with the circle planer shape.

In this step, the cutting process is performed from the back surface 1b of the wafer 10 shown in FIG. 19 with the blade 36 being in contact with the wafer 10, whereby the wafer is cut in the thickness direction from the back surface 1b to the front surface 1t. After completion of this step, as shown in FIG. 15, the disk-shaped center part 11 is separated from the ring-shaped peripheral edge part 12.

Note that FIG. 19 shows an example in which the blade 36 is not superimposed over the stepped portion 13 of the wafer 10 in the thickness direction. When a difference in height of the stepped portion 13 is small, a part of the blade 36 may be superimposed over the stepped portion 13. In this case, the cutting width of the blade 36 is preferably thick in view of improving the durability of the blade 36.

In the peripheral edge part separation step, after the circle cutting step described above, as shown in FIG. 20, UV rays are radiated in preparing for removing the peripheral edge part 12 already separated from the center part 11, from the holding tape 31 (UV rays radiation step). The adhesive layer 31a shown in FIG. 19 contains an UV curable resin. As shown in FIG. 20, the holding tape 31 is radiated from the lower surface 31b side with the UV rays UVR, thus facilitating removal of the holding tape 31 from the wafer 10.

Note that in radiation of the UV rays UVR, the holding tape 31 is not immediately peeled off the wafer 10, but the holding force of the holding tape 31 for the wafer 10 becomes weak. Thus, in this step, the entire holding tape 31 may be irradiated with the UV rays UVR.

In the peripheral edge part separation step, after the UV radiation step described above, as shown in FIG. 15, the ring-shaped peripheral edge part 12 is peeled off and removed from the holding tape 31 with the center part 11 of the wafer 10 being held by the holding tape 31 (peripheral edge part removal step).

In the peripheral edge part removal step, as shown in FIG. 21, after holding the peripheral edge part 12 of the wafer 10 by a chuck of a delivery jig 39, the peripheral edge part 12 is raised up with the center part 11 attached to the holding tape 31.

After completion of the peripheral edge part separation step, the center part 11, for example, of approximately 50 µm in thickness remains on the holding tape 31. Here, when peeling off the center part 11 from the holding tape 31, the warpage and deformation can occur. However, the holding tape 31 is thicker than the center part 11 of the wafer 10. Specifically, in the example in FIG. 17, the thickness of the base material 31f of the holding tape 31 is in a range of approximately 150 µm to 200 µm. In this way, when the holding tape 31 thicker than the center part 11 of the wafer 10 is attached to the wafer 10, the holding tape 31 serves as a reinforcing member. Thus, while the holding tape 31 is attached to the wafer 10, the wafer 10 can be prevented from being warped or deformed.

<Mark Formation Step>

Figure 22:
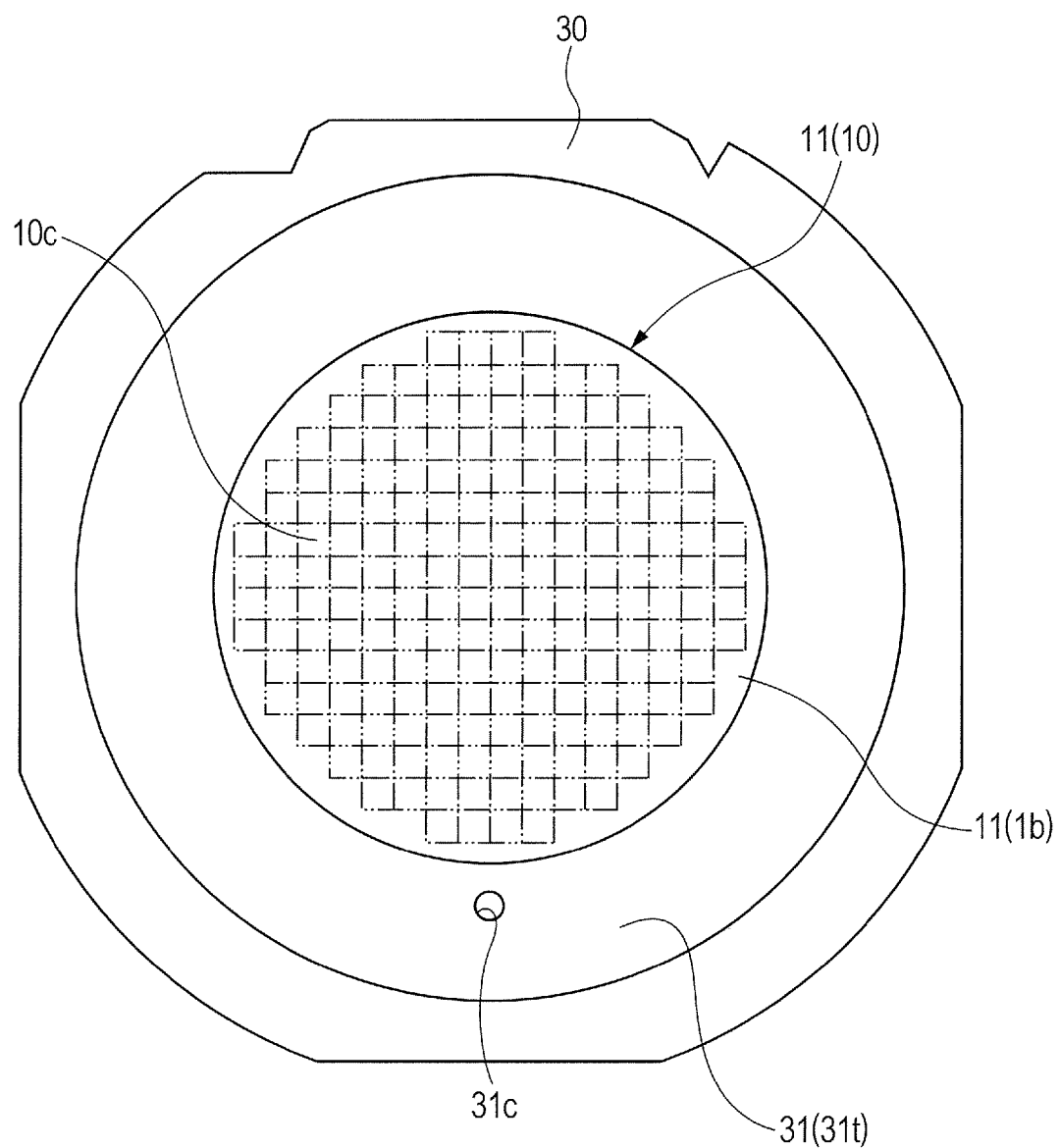
FIG. 22 is a plan view showing a state of forming a mark in the holding tape that holds the center part of the wafer shown in FIG. 21.

Then, in the mark formation step shown in FIG. 8, as shown in FIG. 22, a through hole is made in the holding tape 31 to thereby form a mark 31c indicative of an identification mark for specifying the direction of the wafer 10. FIG. 22 is a plan view showing the state of forming the mark in the holding tape that holds the center part of the wafer shown in FIG. 21.

As shown in FIG. 22, after the peripheral edge part separation step, the notch 10n provided in the peripheral edge part 12 of the wafer 10 shown in FIG. 18 is removed with the peripheral edge part 12. Until the center part 11 of the wafer 10 is separated from the fixing ring 30, the wafer 10 can be aligned using the fixing ring 30 as the reference. Once the wafer 10 is separated from the fixing ring 30, an identification mark for alignment, that is, a mark for identifying the direction of the wafer 10 is required.

For this reason, in this embodiment, before a tape cutting step to be described later, the mark formation step is performed to form the mark 31c in the holding tape 31. In the example as shown in FIG. 22, the mark 31c is a circular through hole. Note that various modifications can be made to the shape of the mark 31c as long as it can specify the direction of the wafer 10. As a formation method for the mark 31*c*, for example, press processing using a molding die can be performed to form the mark 31*c*. Alternatively, radiation of light from a laser may be used to form the mark.

The position in which the mark 31*c* is formed is not specifically limited thereto. However, when taking into consideration the ease in identifying the position of the mark 31*c*, the mark 31*c* is preferably formed in the position where the notch 10*n* shown in FIG. 18 exists.

<Tape Cutting Step>

Figure 23:
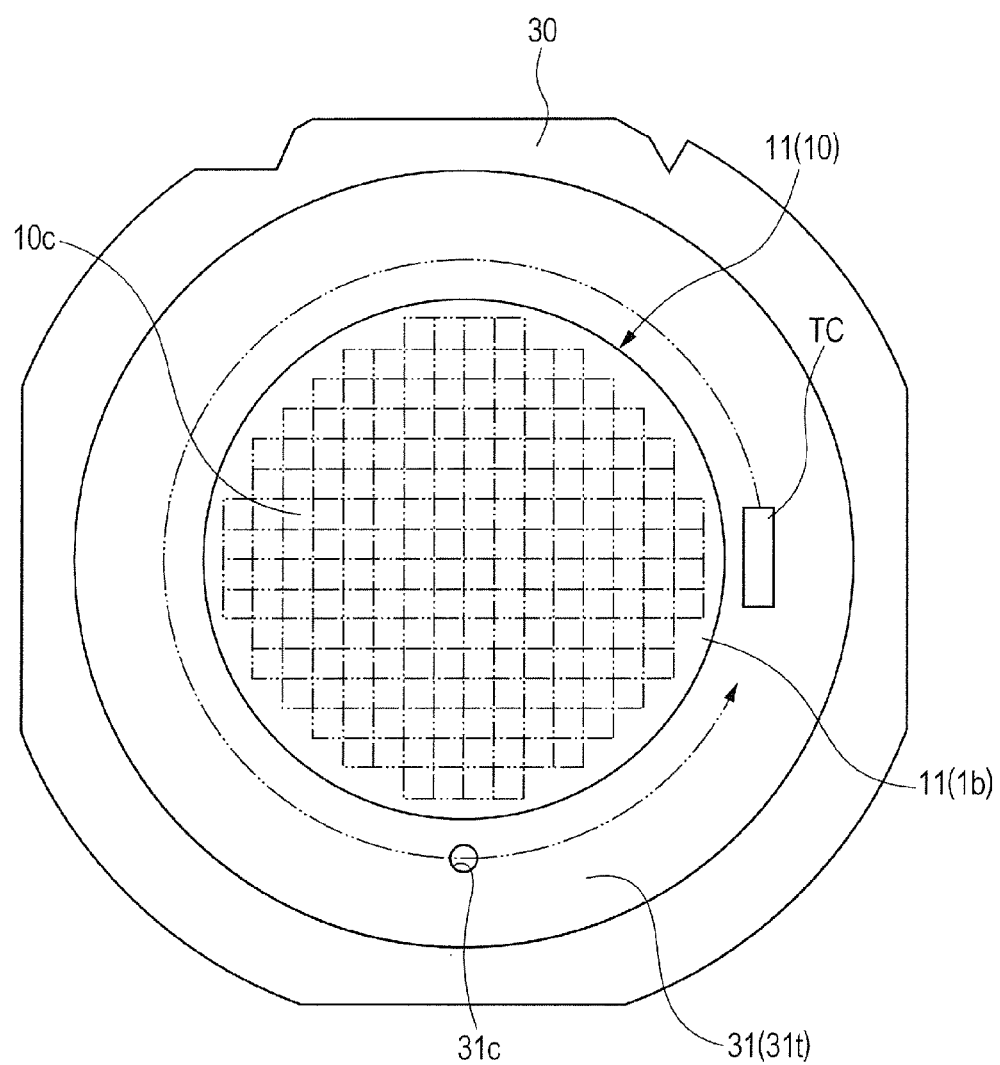
FIG. 23 is a schematic plan view showing a manner in which the holding tape for holding the center part of the wafer shown in FIG. 22 is cut to separate the wafer from the fixing ring.

Then, in the tape cutting step shown in FIG. 8, as shown in FIG. 23, the holding tape 31 around the center part 11 of the wafer 10 is cut to separate the center part 11 from the fixing ring 30. FIG. 23 is a schematic plan view showing a manner in which the holding tape for holding the center of the wafer shown in FIG. 22 is cut to separate the wafer from the fixing ring.

As shown in FIG. 23, in this step, for example, the wafer 10 is separated from the fixing ring 30 by cutting using the tape cutter TC so as to surround the center part 11 of the wafer 10. Since the fixing ring 30 has only to be separated from the wafer 10 in this step, various modifications can be made to the cutting position of the holding tape 31. In the example shown in FIG. 23, the tape cutter TC is moved in a circular shape so as to trace the position of the outer peripheral edge of the peripheral edge part 12 of the wafer 10 shown in FIG. 18. Thus, the holding tape 31 having the same planar dimension as the wafer 10 before removal of the peripheral edge part 12 is obtained. In this case, in the wafer separation step shown in FIG. 8, this arrangement is preferable in that the wafer separation step can be performed by regarding the peripheral edge part of the holding tape 31 as the peripheral edge part of the wafer.

<Wafer Separation Step>

Figure 24:
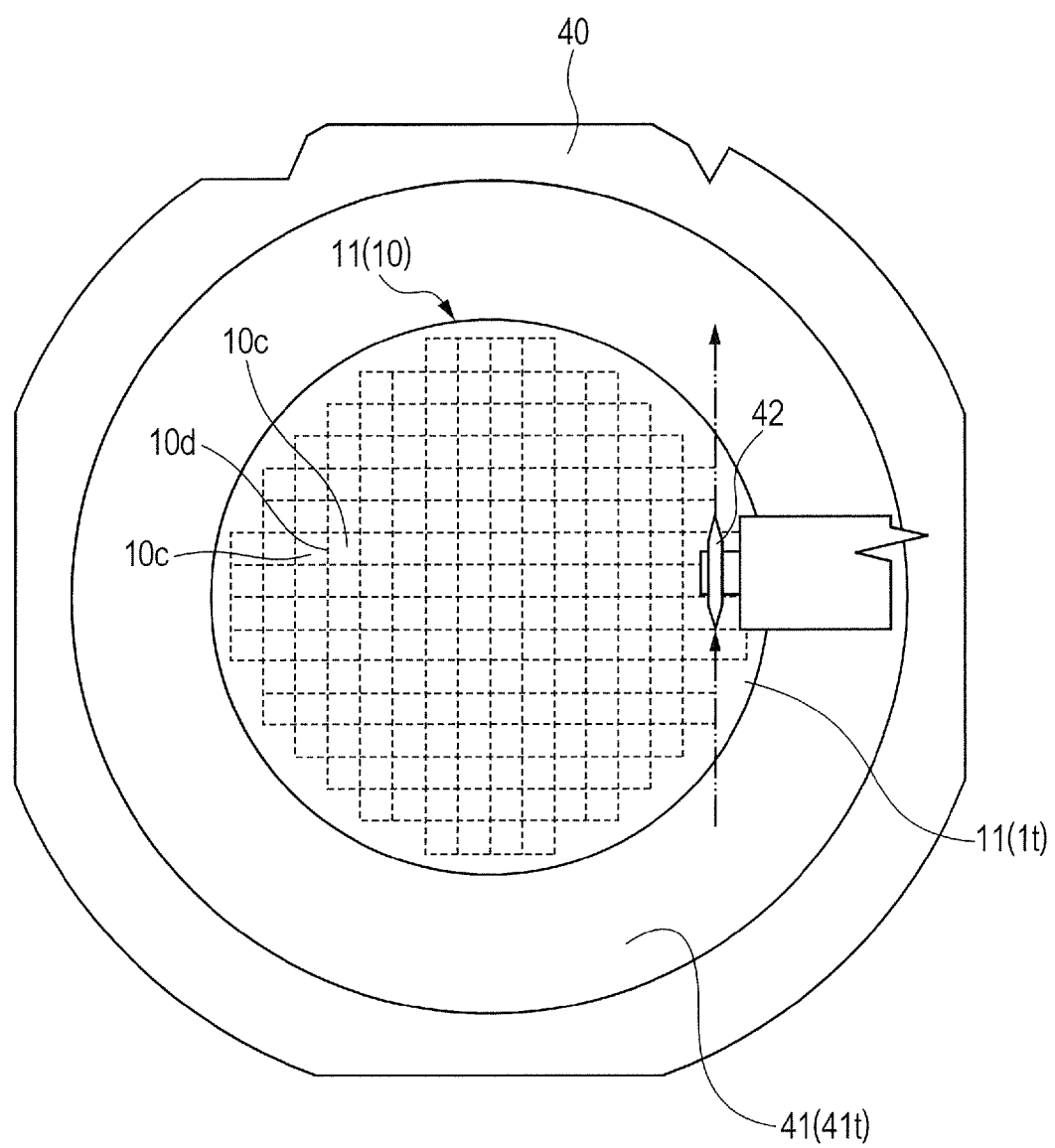
FIG. 24 is a schematic plan view showing a manner of a wafer separation step of separating the wafer shown in FIG. 23 into chip regions.
Figure 25:
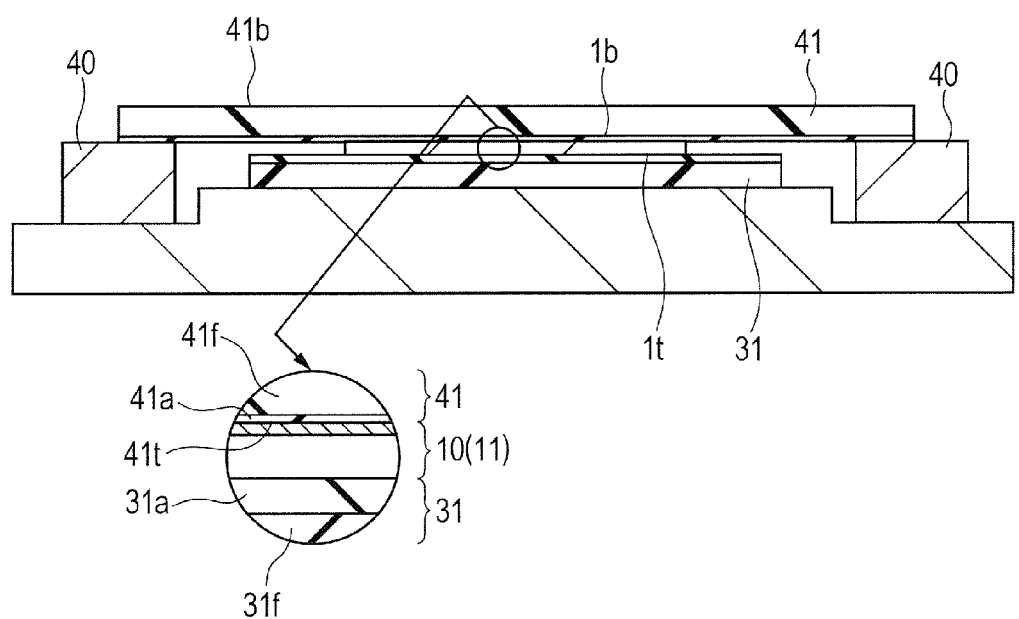
FIG. 25 is a cross-sectional view showing a state of laminating the wafer shown in FIG. 23 with a holding film for the wafer separation step.
Figure 26:
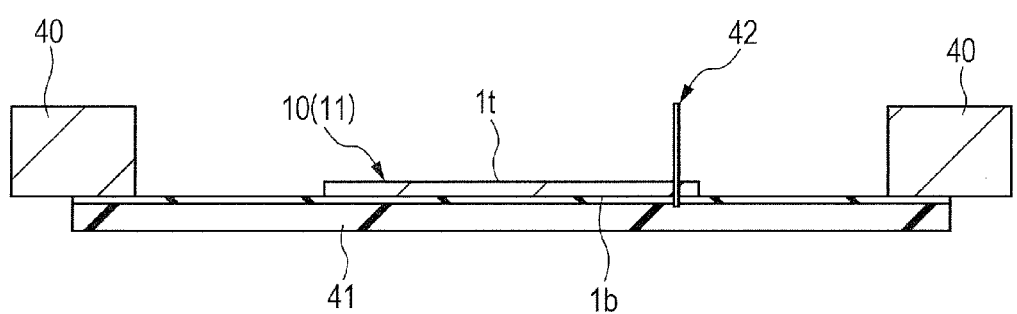
FIG. 26 is a cross-sectional view showing a step of cutting the wafer shown in FIG. 25 with a blade.

Then, as schematically indicated with arrows in FIG. 24, in the wafer separation step, the wafer 10 is cut using the blade 42 along the extending direction of the dicing region 10*d*, thereby separating the wafer 10 into chip regions 10*c*. FIG. 24 is a schematic plan view showing a manner of a wafer separation step of separating the wafer shown in FIG. 23 into chip regions. FIG. 25 is a cross-sectional view of attaching the holding film for a wafer separation step to the wafer shown in FIG. 23. FIG. 26 is a cross-sectional view showing a step of cutting the wafer shown in FIG. 25 with a blade.

Note that in FIG. 24, to easily distinguish between the dicing region 10*d* and the traveling direction of the blade 42, dicing regions are indicated by dotted lines, and arrows indicative of the traveling direction of the blade 42 are indicated by dashed-two dotted lines.

In the wafer separation step, as shown in FIG. 25, in preparing for separating the wafer 10, the holding tape (dicing tape, wafer-separation holding tape) 41 is attached to the wafer 10, thereby fixing the wafer 10 to the fixing ring (supporting member) 40 via the holding tape 41 (wafer-separation holding tape attachment step).

The fixing ring 40 is a supporting member for delivering and fixing the wafer 10 onto a working stage (not shown) in the wafer separation step. The fixing ring 40 is a ring-shaped metal member. The holding tape 41 is a resin film that is attached to the fixing ring 40 in a tense manner. As shown in FIG. 25, one surface of the resin base material 41*f* is covered with an adhesive layer 41*a*. In the upper surface 41*t* and lower surface 41*b* of the holding tape 41, the upper surface 41*t* with the adhesive layer 41*a* formed thereon serves as a bonding surface of the holding tape 41.

As shown in FIG. 25, the wafer 10 subjected to the process in this step is the center part 11 with the peripheral edge part (see FIG. 15) already removed therefrom, and has a uniform thickness. Thus, in this step, the upper surface 41*t*, which is the bonding surface of the holding tape 41, is attached to the back surface 1*b* of the wafer 10. When attaching the holding tape 41 onto the back surface 1*b* of the wafer 10 in this way, as shown in FIG. 9, the holding tape can be aligned with high accuracy by recognizing metal patterns, including the source terminal 1ST and the gate terminal 1GT, formed at the side of the front surface 1*t*.

The back surface 1*b* of the wafer 10 has a higher flatness than that of the front surface 1*t*. Thus, as shown in FIG. 25, the adhesive layer 41*a* of the holding tape 41 is thinner than the adhesive layer 31*a* of the holding tape 41. In this way, the adhesive layer 41*a* of the holding tape 41 is thinned, whereby the components of the adhesive layer 41*a* are attached to the blade 42 during the cutting process using the blade 42 (see FIG. 24), thus suppressing reduction in cutting workability of the blade 42.

In this embodiment, as shown in FIG. 25, the holding tape 41 is attached to the back surface 1*b* with the holding tape 31 attached to the front surface 1*t* of the wafer 10. Thereafter, the holding tape 31 is peeled off the front surface 1*t* of the wafer 10. That is, until the wafer 10 is separated, at least one of the holding tape 31 and the holding tape 41 is attached to the wafer 10. Each of the holding tape 41 and the holding tape 31 is thicker than that of the wafer 10 obtained after the backgrinding, and at least one of the holding tape 31 and the holding tape 41 is attached to the wafer 10, which can suppress the warpage and deformation of the wafer 10.

In the wafer separation step, after the above-mentioned holding tape attachment step for wafer separation, the wafer 10 is subjected to a cutting process with the blade (rotary blade) 42 while the wafer 10 is held by the holding tape 31, as shown in FIGS. 24 and 26, thereby separating the wafer into the chip regions 10*c* (see FIG. 24) (dicing step).

As shown in FIG. 26, in this step, the blade 42 is traveled from the front surface 1*t* of the wafer 10 along the dicing region 10*d* (see FIG. 24), thereby cutting the wafer 10 to separate the wafer 10 into the chip regions 10*c*. The blade 42 is a cutting jig (rotary blade) having a plurality of abrasive grains made of diamond and the like and fixed to the outer periphery of a thin plate with a substantially circular outer shape. The blade 42 acts to cut the wafer by performing the cutting process on the object to be cut with the abrasive grains fixed to the outer periphery through rotation of the thin plate.

When the blade 42 linearly moves while being rotated in this step, the load on the blade 42 becomes small, compared to the case in which the blade 36 is moved to draw an arc in the circle cutting step shown in FIG. 18 described above. Thus, the width of the blade 42 shown in FIG. 26 (cutting process width) may be made narrower than that of the blade 36 (cutting process width) shown in FIG. 19. In this case, since the width of the dicing region 10*d* shown in FIG. 9 can be narrowed, the effective area of the chip region 10*c* is increased. As a result, the number of semiconductor chips obtainable from one piece of wafer 10 can be increased to improve the manufacturing efficiency.

Note that when the wafer 10 is thin enough and the load on the blade 36 in the circle cutting step is small enough, the width (cutting process width) of the blade 42 shown in FIG. 26 may be substantially the same as that of the blade 36 (cutting process width) shown in FIG. 19. In this case, the area of the center part 11 can be widened.

<Chip Obtaining Step>

Then, in the chip obtaining step, the respective divided chip regions 10*c* (see FIG. 24) are individually taken out from the holding tape 41 shown in FIG. 26 to produce a plurality of semiconductor chips 1 shown in FIGS. 1 to 3. The step of individually taking out the respective chip regions 10c from the holding tape 41 can be performed by applying a general technique for taking singulated semiconductor chips out of a dicing tape. For example, ultraviolet curable resin components before curing are allowed to be previously contained in the adhesive layer 41a (see FIG. 25) of the holding tape 41 in advance. After the wafer separation step, the holding tape 41 is irradiated with UV rays and an adhesive paste is cured, the bonding strength of the holding tape 41 is reduced. If the bonding strength of the holding tape 41 is reduced, the respective chip regions 10c (semiconductor chips 1 shown in FIGS. 1 to 3) can be easily taken out using a holding jig (pickup jig), for example, called a collet (not shown). In this step, the semiconductor chip 1 having a very small thickness is handled. In the above-mentioned wafer separation step, however, the singulated semiconductor chip 1 has a planar area of each of the front surface 1t and back surface 1b smaller than the integrated wafer 10 (see, for example, FIG. 24), making it unlikely to cause deformation and damage of the semiconductor chip in handling.

In the steps described above, the semiconductor chip 1 shown in FIGS. 1 to 3 will be obtained. That is, the semiconductor chip provision step shown in FIG. 8 will be ended.

<Assembly Steps for Semiconductor Device>

Then, the assembly steps for the semiconductor device PKG1 shown in FIGS. 4 to 7 will be briefly described referring to FIG. 8. Note that in this section, the assembly steps will be described with reference to FIGS. 4 to 7.

First, in the base material provision step shown in FIG. 8, a lead frame is provided which includes the tab 3 supported by the suspension leads TL as shown in FIG. 6, and a plurality of leads 4 provided around the tab 3.

Then, in a chip mounting step, the semiconductor chip 1 provided in the above-mentioned semiconductor chip provision step is mounted on the tab 3 of the lead frame as shown in FIG. 6. In this step, as shown in FIG. 7, the semiconductor chip 1 is mounted over the tab 3 via the conductive bonding material 6 with the back surface 1b of the semiconductor chip 1 opposed to the upper surface 3t of the tab 3. After mounting the semiconductor chip 1, the conductive bonding material 6 is cured to thereby fix the semiconductor chip 1 onto the tab 3. The drain terminal 1DT configuring the electrode on the side of the back surface 1b of the semiconductor chip 1 is electrically coupled to the tab 3 via the conductive bonding material 6.

Then, in the lead coupling step, terminals of the semiconductor chip 1 are electrically coupled to the leads 4 provided around the tab 3. In the example shown in FIG. 6, the gate terminal 1GT is electrically coupled to the lead 4G via a wire 9 (wire bonding step). The source terminal 1ST is electrically coupled to the lead 4S via a metal clip 7 (clip bonding step). Note that as shown in FIG. 7, the drain terminal 1DT is provided at the back surface 1b side of the semiconductor chip 1. At the time of the semiconductor chip mounting step, the drain terminal 1DT is electrically coupled to the lead 4S.

Next, in the sealing step shown in FIG. 8, as shown in FIG. 7, the semiconductor chip 1, the metal clip 7, and the leads 4 are partly sealed with resin to form the sealing body 5. As shown in FIG. 5, in this step, the semiconductor device PKG1 having parts of the leads 4 exposed from the sealing body 5 is obtained.

FIGS. 4 to 7 show the completed product of the semiconductor device PKG1. In the manufacturing method of the semiconductor device, a plurality of semiconductor devices PKG1 is collectively manufactured using the lead frame with a plurality of product regions in many cases. In this case, in the singulation step shown in FIG. 8, the suspension leads TL and the leads 4 shown in FIG. 6 are separated from the lead frame to be singulated.

Then, in the inspection and selection steps, the inspection, such as outer appearance check, is performed to select whether the product is good or bad, whereby the semiconductor device PKG1 shown in FIGS. 4 to 7 is obtained.

<Modified Examples>

Although the invention made by the inventors have been specifically described based on the embodiments, the invention is not limited to the above-mentioned embodiments. It is apparent that various modifications and changes can be made without departing from the scope of the invention. For example, a plurality of modified examples described above or explained below may be applied in combination.

For example, the above-mentioned embodiments have described the semiconductor chip 1 including the MOSFET as one example of the semiconductor device and the semiconductor device PKG1 as a semiconductor package with the semiconductor chip 1 mounted thereon by way of example. However, there are various modified examples of the semiconductor device to which the above-mentioned technique can be applied. In some cases, for example, distribution systems for the semiconductor device include a step of forming a plurality of circuits in a semiconductor wafer and another step of separating (singulating) the semiconductor wafer into individual chip regions; these steps are performed at different business facilities. In such a case, a semiconductor wafer that is obtained as an interim product before the above-mentioned wafer separation step can also be considered as the semiconductor device.

In this case, after performing necessary inspections, such as appearance check, of the wafer 10 fixed to the fixing ring 30 shown in FIG. 22, the wafer may be packaged and shipped. Alternatively, the holding tape 31 around the wafer 10 may be cut in a ring-like shape using the tape cutter TC shown in FIG. 23, and the wafer with the holding tape 31 attached may be shipped.

For example, in the above-mentioned embodiments, which would easily cause the warpage and deformation of the wafer without any measures, the product in which the thickness of the center part 11 is ground to 100 μm or less has been explained. Based on the studies by the inventors of the present application, even wafers having a thickness of more than 100 μm may have the warpage and deformation. For example, as shown in FIG. 14, when the metal film 15 is formed to uniformly cover the back surface 1b side of the wafer 10, the warpage or deformation sometimes occurs in the wafer even if it has a thickness of 100 μm or more. When the wafer 10 has, for example, a diameter of more than 200 mm, even if the thickness of the wafer is more than 100 μm, the warpage and deformation could occur in the wafer in some cases.

Figure 27:
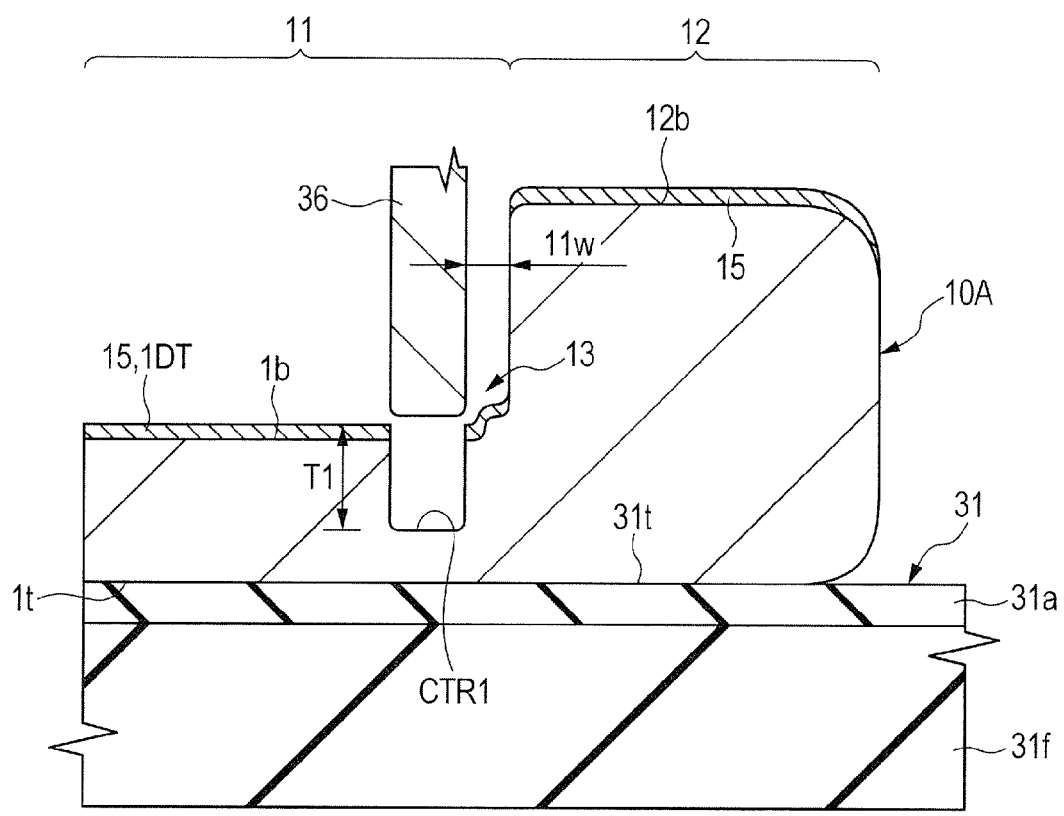
FIG. 27 is an enlarged cross-sectional view showing a state of forming a trench in the peripheral edge part of the center part of the wafer at a first cutting step in a circle cut process of a modified example corresponding to FIG. 19.
Figure 28:
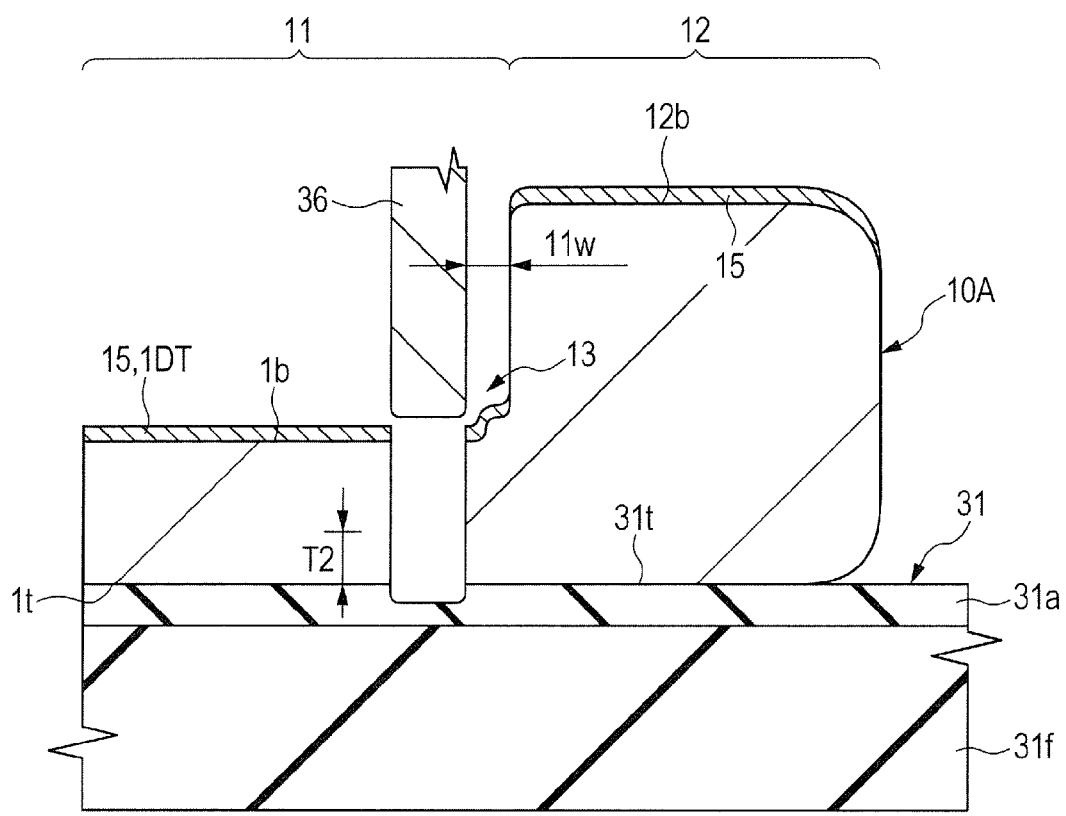
FIG. 28 is an enlarged cross-sectional view showing the state of cutting the wafer by applying a cutting process to the wafer along the trench shown in FIG. 27.

For this reason, the inventors of the present application have studied these matters by applying the technique described in the above-mentioned embodiments to a wafer in which the center part 11 shown in FIG. 14 has a thickness of more than 100 μm. As a result, it is found that for the wafer with the thick center part 11, a load on the blade in the circle cutting step should be reduced. FIG. 27 is an enlarged cross-sectional view showing a state of forming a trench in the peripheral edge part around the center part of the wafer at a first cutting step in the circle cutting step of a modified example corresponding to FIG. 19. FIG. 28 is an enlarged cross-sectional view showing the state of cutting the wafer by applying the cutting process to the wafer along the trench shown in FIG. 27.

Although FIGS. 27 and 28 omit the illustration of the stage 37 shown in FIG. 19, even in this modified example, the cutting process is performed on the stage 37. The wafer 10A shown in FIGS. 27 and 28 are semiconductor wafers each having the same structure as that of the wafer 10 shown in FIG. 19 except that the thickness of the center part 11 is large (for example, 200 μm).

As described in the above-mentioned embodiment, the circle cutting step involves moving the blade 36 to draw an arc while rotating the blade 36 as shown in FIG. 18. That is, the blade 36 carries out the cutting process while moving non-linearly. When the cutting process is performed while moving the blade 36 non-linearly in this way, the load on the blade becomes large like the above-mentioned wafer separation step, compared to the case where the cutting process is performed linearly. The load on the blade is increased in proportion to the thickness of the wafer which is an object to be cut.

The larger load on the blade would cause uneven wear of the blade (phenomenon in which one grinding surface of the blade is more likely to wear than the other surface thereof) or damage to the blade. Further, the larger load on the blade sometimes makes the cutting process unstable to leave cuttings in the peripheral edge part of a position to be cut, of the wafer as an object to be cut. As can be seen from the studies by the inventors of the present application, the above-mentioned problems of damage to the blade and cuttings would be drastically caused when the wafer has a thickness of more than 150 μm.

Techniques for reducing the load on a blade in the circle cutting step have been studied and then the following method has been found out. That is, the technique is a method that involves cutting the wafer 10A from the back surface 1b to the front surface 1t by performing the cutting process a plurality of times in the circle cutting step.

In a modified example, first, as shown in FIG. 27, the cutting process is applied to the back surface 1b side of the center part 11 using the blade 36 to form a trench CTR1 (trench formation step). In this modified example, after the above-mentioned trench formation step, the cutting process is performed along the trench CTR1 using the blade 36 to thereby cut the center part 11 in the thickness direction (cutting step). When an object to be cut, like the wafer 10A, is thick, the cutting process is performed a plurality of times to enable reduction in load on the blade 36.

As further considered by the inventors of the present application, like this modified example, when performing the cutting process a plurality of times, a cutting depth (depth T1 shown in FIG. 27) in the previous cutting process (the above-mentioned trench formation step) is preferably deeper than that of a cutting trench depth (depth T2 shown in FIG. 28) in the following cutting process (in the above-mentioned cutting step). The above-mentioned cuttings are most likely to occur when cutting the wafer 10A. Thus, the part to be cut in the cutting step is previously thinned, which can suppress the occurrence of cuttings.

Note that the depth of the trench CTR1 in the trench formation step shown in FIG. 27 is preferably suppressed to less than 150 μm. Therefore, when the thickness of the wafer 10A is more than 300 μm, the cutting process is preferably performed three times. In this case, the cutting trench depth by the first cutting process is preferably deeper than that cut from the wafer 10A in the third cutting process.

When performing the cutting process a plurality of times, like this modified example, a method that involves using the blades 36 with different width may also be used. Note that to widen the effective area of the center part 11, the width of the blade 36 is preferably as narrow as possible. Therefore, as shown in FIGS. 27 and 28, in the trench formation step and the cutting step, the cutting process is preferably performed using the blade 36 with the same width.

Note that although in the present modified example, the wafer 10A is cut by performing the cutting process a plurality of times, the blade 36 may be temporarily detached from the wafer 10A between the first cutting process and the second cutting process. In this case, before the second cutting process, the blade 36 is aligned to be inserted into the trench CTR1 formed in the first cutting process.

Note that in a further modified example of this modified example, the blade 36 may not be detached from the wafer 10A between the first cutting process and the second cutting process. In other words, the blade 36 and the wafer 10A may be maintained in contact with each other between the first cutting process and the second cutting process. For example, if the blade 36 is continuously orbited a plurality of times along a circular track indicated by an alternate long and two short dashes line in FIG. 18, the blade 36 and the wafer 10A are maintained in contact with each other as mentioned above. In this case, the alignment does not need to be performed between the first cutting process and the second cutting process, thereby enabling improvement of the manufacturing efficiency.

What is claimed is:

1. A method of manufacturing a semiconductor device, comprising:
   (a) forming a circuit on a first surface of a semiconductor wafer, the semiconductor wafer having a second surface opposite to the first surface;
   (b) grinding the second surface of the semiconductor wafer such that a first part is thinner than a second part surrounding the first part;
   (c) attaching a bonding surface of a first tape to the first surface of the semiconductor wafer;
   (d) separating the first part from the second part by cutting a part of the first part with a rotary blade in contact with the second surface of the first part, while the semiconductor wafer is held by the first tape;
   (e) after (d), removing the second part;
   (f) attaching a bonding surface of a second tape to the second surface side of the first part of the semiconductor wafer while the first tape remains attached to the semiconductor wafer; and
   (g) after (f), peeling off the first tape from the semiconductor wafer,
   wherein the first tape includes:
      a first base material, and
      a first adhesive layer provided at one surface of the first base material and attached to the first surface of the semiconductor wafer,
   wherein the second tape includes:
      a second base material, and
      a second adhesive layer provided at one surface of the second base material and attached to the second surface of the first part of the semiconductor wafer, and
   wherein the first adhesive layer is thicker than the second adhesive layer.

2. The method of manufacturing a semiconductor device according to claim 1,
wherein the first tape is thicker than the first part after (b).

3. The method of manufacturing a semiconductor device according to claim 1,
wherein the first part of the semiconductor wafer includes a plurality of chip regions and a plurality of dicing regions provided between the chip regions, the method further comprising:
after (g), cutting the first part along respective extending directions of the dicing regions with a rotary blade in contact with the first surface side of the first part while the semiconductor wafer is held by the second tape, thereby separating the wafer into the respective chip regions.

4. A method of manufacturing a semiconductor device, comprising:
(a) forming a circuit on a first surface of a semiconductor wafer, the semiconductor wafer having a second surface opposite to the first surface;
(b) grinding the second surface of the semiconductor wafer such that a first part is thinner than a second part surrounding the first part;
(c) attaching a bonding surface of a first tape to the first surface of the semiconductor wafer; and
(d) separating the first part from the second part by cutting a part of the first part with a rotary blade in contact with the second surface of the first part, while the semiconductor wafer is held by the first tape,
wherein (d) comprises:
(d1) forming a trench by performing a cutting process at the second surface side of the first part by moving the rotary blade to draw an arc along an outer edge of the first part of the semiconductor wafer while rotating the rotary blade; and
(d2) after (d1), performing another cutting process by moving the rotary blade along the trench to further cut the first part in a thickness direction thereof, thereby separating the first part from the second part.

5. The method of manufacturing a semiconductor device according to claim 4,
wherein a depth of the trench formed in (d1) is greater than a depth of the another cutting process performed in (d2).

6. The method of manufacturing a semiconductor device according to claim 4,
wherein a width of the cutting process in (d1) is substantially the same as that of the another cutting process in (d2).

7. The method of manufacturing a semiconductor device according to claim 4,
wherein the rotary blade and the semiconductor wafer are maintained in contact with each other between (d1) and (d2).

8. The method of manufacturing a semiconductor device according to claim 1,
wherein in (d), the semiconductor wafer is cut along an outer edge of the first part.

9. The method of manufacturing a semiconductor device according to claim 1,
wherein in (d), the first part is cut to draw an arc along an outer edge of the first part of the semiconductor wafer.

10. The method of manufacturing a semiconductor device according to claim 1,
wherein after (b), a thickness of the first part is equal to or less than 100 μm.

11. The method of manufacturing a semiconductor device according to claim 1, further comprising:
after (b) and before (c), forming a metal film to cover the second surface of the first part.

12. The method of manufacturing a semiconductor device according to claim 1, further comprising:
after (d), forming a mark for identifying a direction of the semiconductor wafer, in a part of the first tape.

13. A method of manufacturing a semiconductor device, comprising:
(a) forming a circuit on a first surface of a semiconductor wafer, the semiconductor wafer having a second surface opposite to the first surface;
(b) grinding the second surface of the semiconductor wafer such that a first part is thinner than a second part surrounding the first part;
(c) attaching a bonding surface of a first tape to the first surface of the semiconductor wafer, the first tape being attached to a fixing ring and having a first thickness larger than that of the first part after (b);
(d) separating the first part from the second part by cutting a part of the first part with a rotary blade in contact with the second surface of the first part while the semiconductor wafer is held by the first tape, thereby removing the second part;
(e) after (d), forming a mark for identifying a direction of the semiconductor wafer, in a part of the first tape;
(f) attaching a bonding surface of a second tape to the first part of the semiconductor wafer at a side thereof that is opposite to the first surface, while the first tape remains attached to the semiconductor wafer; and
(g) after (f), peeling off the first tape from the semiconductor wafer,
wherein the first tape includes a first base material and a first adhesive layer between the first base material and the semiconductor wafer,
wherein the second tape includes a second base material and a second adhesive layer between the second base material and the semiconductor wafer, and
wherein the first adhesive layer is thicker than the second adhesive layer.

14. The method of manufacturing a semiconductor device according to claim 13, further comprising:
after (e), separating the semiconductor wafer held by the first tape from the fixing ring by cutting a periphery of the first tape.

15. The method of manufacturing a semiconductor device according to claim 14,
wherein the second tape is attached to a second fixing ring different from the fixing ring of the first tape.

16. The method of manufacturing a semiconductor device according to claim 13, wherein (d) comprises:
(d1) forming a trench by performing a cutting process at the second surface side of the first part by moving the rotary blade to draw an arc along an outer edge of the first part of the semiconductor wafer while rotating the rotary blade; and
(d2) after (d1), performing another cutting process by moving the rotary blade along the trench to further cut the first part in a thickness direction thereof.

* * * * *